US006452985B1

(12) United States Patent

Hatakeyama et al.

(10) Patent No.: US 6,452,985 B1

(45) Date of Patent: Sep. 17, 2002

(54) VITERBI DECODING APPARATUS AND VITERBI DECODING METHOD

(75) Inventors: Izumi Hatakeyama; Masahiko Naito, both of Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/270,113

(22) Filed: Mar. 16, 1999

(30) Foreign Application Priority Data

Mar. 18, 1998 (JP) ........................................... 10-068839
Mar. 18, 1998 (JP) ........................................... 10-068840

(51) Int. Cl.[7] ............................ H03D 1/00; H04L 27/06

(52) U.S. Cl. ........................ 375/341; 375/262; 714/795

(58) Field of Search ................................ 375/341, 262, 375/265; 714/792, 795, 794, 796

(56) References Cited

U.S. PATENT DOCUMENTS 5,349,589 A * 9/1994 Chennakeshu et al. ..... 714/795
5,721,745 A * 2/1998 Hladik et al. ............... 714/755
5,721,746 A * 2/1998 Hladik et al. ............... 714/792
6,161,210 A * 12/2000 Chen et al. ................. 714/786

OTHER PUBLICATIONS

H.H. Ma et al., On Tail Biting Convolutional Codes, IEEE Transactions on Communications, vol. 34, No. 32, Feb. 1986, pp. 103–111.

* cited by examiner

*Primary Examiner*—Phuong Phu
(74) *Attorney, Agent, or Firm*—Jay H. Maioli

(57) ABSTRACT

A Viterbi decoding apparatus sets the initial path metric value of each state to a value weighted based on the initial value of a convolutional encoder, and decodes a data string one bit by one bit whenever performing tracing-back for one step with a fixed state determined based on a value of a tail bit as a start-point state when a path metric operation has reached the final operation. Moreover, the Viterbi decoding apparatus selects a maximum-likelihood state out of prospective states determined based on the value of the tail bit and performs tracing-back, until the path metric operation reaches the final operation after it has exceeded the number of data strings. Thus, it is possible to improve the decoding accuracy and the decoding speed.

10 Claims, 18 Drawing Sheets

| STATE | a2 | a3 |
|---|---|---|
| A | 0 | 0 |
| B | 1 | 0 |
| C | 0 | 1 |
| D | 1 | 1 |

| TRANSMISSION | DATA REPLACEMENT RATE | NUMBER OF SYMBOLS AFTER INTERLEAVING | NUMBER OF SYMBOLS AFTER CONVOLUTIONAL ENCODING | CONVOLUTIONAL ENCODING RATE | DATA COTENT / 20msec | INFORMATION | CRC | TAIL BIT |
|---|---|---|---|---|---|---|---|---|
| 9600bps | 1/12 | 384 symbol | 384 symbol | 1/2 | 192bit | 172bit | 12bit | 8bit |

FIG. 9

| bit3 | bit2 | bit1 | bit0 | POLARITY | RELIABILITY | Metric(Hex) | |
|---|---|---|---|---|---|---|---|
| | | | | | | BM0 | BM1 |
| 0 | 1 | 1 | 1 | 0 | High | 0 | F |
| 0 | 1 | 1 | 0 | 0 | | 1 | E |
| 0 | 1 | 0 | 1 | 0 | | 2 | D |
| 0 | 1 | 0 | 0 | 0 | | 3 | C |
| 0 | 0 | 1 | 1 | 0 | | 4 | B |
| 0 | 0 | 1 | 0 | 0 | | 5 | A |
| 0 | 0 | 0 | 1 | 0 | | 6 | 9 |
| 0 | 0 | 0 | 0 | 0 | Low | 7 | 8 |
| 1 | 1 | 1 | 1 | 1 | Low | 8 | 7 |
| 1 | 1 | 1 | 0 | 1 | | 9 | 6 |
| 1 | 1 | 0 | 1 | 1 | | A | 5 |
| 1 | 1 | 0 | 0 | 1 | | B | 4 |
| 1 | 0 | 1 | 1 | 1 | | C | 3 |
| 1 | 0 | 1 | 0 | 1 | | D | 2 |
| 1 | 0 | 0 | 1 | 1 | | E | 1 |
| 1 | 0 | 0 | 0 | 1 | High | F | 0 |

FIG. 12

| bit3 | bit2 | bit1 | bit0 | POLARITY | RELIABILITY | Metric(Hex) | |
|---|---|---|---|---|---|---|---|
| | | | | | | BM0 | BM1 |
| 0 | 1 | 1 | 1 | 0 | High | 0 | D |
| 0 | 1 | 1 | 0 | 0 | | 1 | C |
| 0 | 1 | 0 | 1 | 0 | | 2 | B |
| 0 | 1 | 0 | 0 | 0 | | 3 | A |
| 0 | 0 | 1 | 1 | 0 | | 4 | 9 |
| 0 | 0 | 1 | 0 | 0 | | 5 | 8 |
| 0 | 0 | 0 | 1 | 0 | Low | 6 | 7 |
| 0 | 0 | 0 | 0 | DELETED | | 0 | 0 |
| 1 | 1 | 1 | 1 | 1 | Low | 7 | 6 |
| 1 | 1 | 1 | 0 | 1 | | 8 | 5 |
| 1 | 1 | 0 | 1 | 1 | | 9 | 4 |
| 1 | 1 | 0 | 0 | 1 | | A | 3 |
| 1 | 0 | 1 | 1 | 1 | | B | 2 |
| 1 | 0 | 1 | 0 | 1 | | C | 1 |
| 1 | 0 | 0 | 1 | 1 | High | D | 0 |
| 1 | 0 | 0 | 0 | NOT USED | | | |

FIG. 13

| State00=000 | State01=03A | State02=057 | State03=057 | State04=091 | State05=057 | State06=074 | State07=074 |
|---|---|---|---|---|---|---|---|
| State08=0CB | State09=091 | State0A=074 | State0B=074 | State0C=074 | State0D=0AE | State0E=091 | State0F=091 |
| State10=0E8 | State11=0E8 | State12=0CB | State13=091 | State14=091 | State15=091 | State16=074 | State17=0AE |
| State18=091 | State19=091 | State1A=0AE | State1B=0E8 | State1C=0AE | State1D=0AE | State1E=0CB | State1F=091 |
| State20=105 | State21=105 | State22=0EB | State23=0E8 | State24=0E8 | State25=0E8 | State26=0CB | State27=091 |
| State28=0AE | State29=0AE | State2A=0CB | State2B=091 | State2C=091 | State2D=091 | State2E=0AE | State2F=0E8 |
| State30=0CB | State31=091 | State32=0AE | State33=0AE | State34=0AE | State35=0E8 | State36=105 | State37=105 |
| State38=0AE | State39=0AE | State3A=0C8 | State3B=0CB | State3C=0CB | State3D=0CB | State3E=0AE | State3F=0AE |
| State40=105 | State41=0CB | State42=0E8 | State43=0EB | State44=0E8 | State45=0E8 | State46=105 | State47=105 |
| State48=0E8 | State49=0E8 | State4A=105 | State4B=105 | State4C=0CB | State4D=0CB | State4E=0AE | State4F=0AE |
| State50=0CB | State51=0CB | State52=0E8 | State53=0AE | State54=0E8 | State55=0E8 | State56=091 | State57=0CB |
| State58=0AE | State59=0AE | State5A=091 | State5B=0CB | State5C=0CB | State5D=0CB | State5E=0E8 | State5F=0E8 |
| State60=0E8 | State61=0E8 | State62=091 | State63=0CB | State64=0CB | State65=0CB | State66=0AE | State67=0AE |
| State68=0CB | State69=0CB | State6A=0AE | State6B=0E8 | State6C=0E8 | State6D=0E8 | State6E=105 | State6F=105 |
| State70=0E8 | State71=0AE | State72=0CB | State73=0CB | State74=0CB | State75=0CB | State76=0E8 | State77=0E8 |
| State78=0CB | State79=105 | State7A=0E8 | State7B=0E8 | State7C=0E8 | State7D=0AE | State7E=0CB | State7F=0CB |
| State80=122 | State81=122 | State82=0CB | State83=105 | State84=105 | State85=105 | State86=0E8 | State87=0E8 |
| State88=0CB | State89=0CB | StateBA=0AE | State8B=0E8 | State8C=0E8 | State8D=0E8 | State8E=105 | State8F=0CB |
| State90=0E8 | State91=0E8 | State92=105 | State93=105 | State94=105 | State95=0CB | State96=0E8 | State97=0E8 |
| State98=0CB | State99=0CB | State9A=0E8 | State9B=0E8 | State9C=0AE | State9D=0AE | State9E=0CB | State9F=0CB |
| StateA0=0CB | StateA1=0CB | StateA2=0E8 | StateA3=0E8 | StateA4=0E8 | StateA5=0E8 | StateA6=0CB | StateA7=0CB |
| StateA8=0AE | StateA9=0E8 | StateAA=105 | StateAB=105 | StateAC=091 | StateAD=0CB | StateAE=0E8 | StateAF=0E8 |
| StateB0=0CB | StateB1=0CB | StateB2=0E8 | StateB3=0AE | StateB4=0AE | StateB5=0AE | StateB6=0CB | StateB7=105 |
| StateB8=0E8 | StateB9=0E8 | StateBA=0CB | StateBB=105 | StateBC=105 | StateBD=105 | StateBE=122 | StateBF=0E8 |
| StateC0=105 | StateC1=105 | StateC2=0E8 | StateC3=0E8 | StateC4=0AE | StateC5=0AE | StateC6=0CB | StateC7=0CB |
| StateC8=0E8 | StateC9=0E8 | StateCA=0CB | StateCB=0CB | StateCC=0CB | StateCD=0CB | StateCE=0AE | StateCF=0E8 |
| StateD0=0CB | StateD1=0CB | StateD2=0E8 | StateD3=0E8 | StateD4=0AE | StateD5=0E8 | StateD6=105 | StateD7=105 |
| StateD8=0E8 | StateD9=0E8 | StateDA=105 | StateDB=105 | StateDC=105 | StateDD=105 | StateDE=122 | StateDF=122 |
| StateE0=0E8 | StateE1=0E8 | StateE2=0CB | StateE3=0CB | StateE4=105 | StateE5=0CB | StateE6=0E8 | StateE7=0E8 |
| StateE8=0CB | StateE9=0CB | StateEA=0E8 | StateEB=0E8 | StateEC=0E8 | StateED=0E8 | StateEE=105 | StateEF=105 |
| StateF0=0E8 | StateF1=0E8 | StateF2=105 | StateF3=105 | StateF4=0CB | StateF5=0CB | StateF6=0E8 | StateF7=0E8 |
| StateF8=105 | StateF9=105 | StateFA=0AE | StateFB=0E8 | StateFC=0E8 | StateFD=0E8 | StateFE=0CB | StateFF=0CB |

FIG. 15

| ACS OPERATION | RESTRICTED STATES |
|---|---|
| FINAL ACS OPERATON | STATE00 |
| {(FINAL ACS OPERATION)-1}TH TIME | STATE00 AND 80 |
| {(FINAL ACS OPERATION)-2}TH TIME | STATE00,40,80 AND C0 |
| {(FINAL ACS OPERATION)-3}TH TIME | STATE00,20,40,60,80,A0,C0, AND E0 |
| {(FINAL ACS OPERATION)-4}TH TIME | STATE00,10,20,30,40,50,60,70,80,90,A0,B0,C0,D0,E0,AND F0 |
| {(FINAL ACS OPERATION)-5}TH TIME | STATE00,08,10,18,20,28,30,38,40,48,50,58,60,68,70,78,80,88, 90,98,A0,A8,B0,B8,C0,C8,D0,D8,E0,E8,F0 AND F8 |
| {(FINAL ACS OPERATION)-6}TH TIME | STATE00,04,08,0C,10,14,18,1C,20,24,28,2C,30,34,38,3C,40,44,48, 4C,50,54,58,5C,60,64,68,6C,70,74,78,7C,80,84,88,8C,90,94,98,9C, A0,A4,A8,AC,B0,B4,B8,BC,C0,C4,C8,CC,D0,D4,D8,DC,E0,E4,E8,EC,F0, F4,F8, AND FC |
| {(FINAL ACS OPERATION)-7}TH TIME | STATE00,02,04,06,08,0A,0C,0E,10,12,14,16,18,1A,1C,1E,20,22,24, 26,28,2A,2C,2E,30,32,34,36,38,3A,3C,3E,40,42,44,46,48,4A,4C,4E, 50,52,54,56,58,5A,5C,5E,60,62,64,66,68,6A,6C,6E,70,72,74,76,78, 7A,7C,7E,80,82,84,86,88,8A,8C,8E,90,92,94,96,98,9A,9C,9E,A0,A2, A4,A6,A8,AA,AC,AE,B0,B2,B4,B6,B8,BA,BC,BE,C0,C2,C4,C6,C8,CA,CC, CE,D0,D2,D4,D6,D8,DA,DC,DE,E0,E2,E4,E6,E8,EA,EC,EE,F0,F2,F4,F6, F8,FA,FC, AND FE |

FIG. 18

VITERBI DECODING APPARATUS AND VITERBI DECODING METHOD

BACKGROUND OF THE INVENTION

1. Field of the Invention

The present invention relates to a Viterbi decoding apparatus and a Viterbi decoding method, and more particularly, is preferably applied to decode encoded data convolutionally encoded by using a Viterbi decoding algorithm in a cellular radio communication system.

2. Description of the Related Art

The field of mobile communication has been quickly advanced in recent years. Particularly, a cellular radio communication system represented by a portable-telephone system has been remarkably developed. In the cellular radio communication system, an area in which communication service is provided is divided into cells of a desired size, a base station serving as a fixed station is set in each of the cells, and a communication terminal unit serving as a mobile station performs radio communication with the base station which is likely under the best available communication condition.

Various systems have been proposed as communication systems of the above cellular radio communication system: for example, the frequency division multiple access (FDMA) system, the time division multiple access (TDMA) system, and the code division multiple access (CDMA) system. Particularly, the CDMA system has an advantage that a lot of channels per cell, that is, a large system capacity can be secured compared to other systems and is noticed as a next-generation cellular radio communication system. Actually, the CDMA system is standardized as the IS-95 standard by the Electronic Industries Association/the Telecommunications Industry Association (EIA/TIA).

Thus, various communication systems have been proposed. However, even when using any communication system, errors may occur in transmission data on a radio transmission line in the case of the cellular radio communication system because the system performs communication through a radio line. Therefore, in the cellular radio communication system, transmission data is convolutionally encoded in order to correct errors in the transmission mode and the encoded data thus obtained is transmitted through a radio transmission line, and the reception side correctly restores the transmitted data by Viterbi-decoding the received encoded data.

The convolutional encoding and Viterbi-decoding are specifically described below. The convolutional encoding is generally referred to as error correction coding, which is an encoding system for dispersing the information of transmission data into a plurality of data by successively applying the convolutional operation to the transmission data to be input. An encoder used for the convolutional encoding is constituted, for example, as shown in FIG. 1. That is, a convolutional encoder 1 is constituted with a shift register 2 having a proper number of stages for successively capturing and shifting input transmission data S1 and exclusive OR circuits 3 and 4 for performing a convolutional operation by applying the exclusive OR operation to the register value at a predetermined stage of the shift register 2. The convolutional encoder 1 is a circuit for outputting output values C1 and C2 of the exclusive OR circuits 3 and 4 as encoded data.

Normally, in the case of convolutional encoding, the number of stages of a shift register is referred to as a constraint length and the rate of the number of encoded data to be output for an input of one bit is referred to as an encoding rate, and the convolutional encoding characteristic is specified by these parameters. In FIG. 1, the number of stages of the shift register 2 is "3" and the encoded data of two bits is output for the input of one bit. Therefore, as for the convolutional encoding characteristic, the constraint length is "3" and the encoding rate is "½".

The encoded data to be output in the convolutional encoding is determined in accordance with a value currently stored in a shift register and a value currently input, and has regularity. For example, in FIG. 1, encoded data values (c1 and c2) are determined in accordance with the two-bit values (a2 and a3) being currently in the shift register 2 and the one-bit value (a1) currently input. In this case, when assuming that four states determined by the two bits (a2 and a3 ) being in the shift register 2 are referred to as "A", "B", "C", and "D", the convolutional encoding can be expressed by the state transition diagram shown in FIG. 2. In this case, the values written on the arrow for the state transition from each state to the next state denote the encoded data (c1 and c2) to be output and the data (a1) then input.

A trellis diagram is obtained by arranging state-transition arrows output from the states A, B, C, and D shown by the above state transition diagram, in the temporally transverse direction as shown in FIG. 3. In FIG. 3, a continuous line shows the case of an input value "0" and a dotted line shows the case of an input value "1". In this connection, each arrow connecting the states is normally referred to as a branch, and a branch route until reaching an optional state is referred to as a path.

In this case, Viterbi decoding restores the convolutionally encoded data to the original data. The Viterbi decoding is also referred to a maximum-likelihood decoding method which restores the correct data to which error correction is applied by observing a received data series while considering a trellis diagram and obtaining the nearest data string on the trellis diagram. An index of likelihood referred to a metric is one of the scales for obtaining the nearest data string. The metric normally uses a hamming distance.

The hamming distance shows the distance between data and generally shows the difference between a received data series and the branch data on a trellis diagram. For example, when the received data series is (1,0), the series is different from the branch (0,0) on the trellis diagram by one bit. Therefore, the hamming distance between these data becomes "1" and therefore, the metric for the branch (0,0) results in "1". Moreover, when the received data series is (1,1), it is different from the branch (0,0) on the trellis diagram by two bits. Therefore, the hamming distance between these data becomes "2" and the metric for the branch (0,0) results in "2".

The Viterbi decoding computes a data series closest to a received data series by obtaining the metric of a branch (hereafter referred to a branch metric) at each time based on the received data series, obtaining the metrics of two paths (hereafter referred to as path metrics) input to each state based on the branch metric to select a higher-likelihood path, selecting the maximum-likelihood path out of the finally surviving paths, and inversely tracing the maximum-likelihood path (this operation is hereafter referred to as tracing-back).

Here, a case of transmitting a transmission data series (1,0,1,0,1,0,0) is considered as an example. When the above transmission data series is input to the register 2 of the convolutional encoder 1 shown in FIG. 1 under the state in which the register 2 is initially set to (0,0,0), (11,01,00,01, 00,01,11) is obtained as the encoded data values c1 and c2. It is assumed that an actually-received reception data series is (01,00,00,01,00,01,11) because an error occurs in a transmission line when such encoded data is transmitted through the radio line.

In the case of Viterbi decoding, as shown in FIG. 4, initial values of path metrics of the states are first uniformly set to "0", the hamming distance between the data value of the received reception data series and the data value of each branch is calculated under the above state to obtain each branch metric, and a path metric is computed in accordance with the branch metric and the path metric at the last time to select a likelihood path at any time. Note that each numeral entered in a circle in FIG. 3 denotes a path metric. For example, at the time t1, two branches from the states A and C are input to the state A. The data value of the branch from the state A is (0,0) and the reception data series is (0,1). Therefore, the branch metric of the branch results in "1". Moreover, since the data value of the branch from the state C is (1,1), the branch metric of the branch also results in "1". In this case, since both the branch metrics are "1", path selection is not performed but the value "1" obtained by merely adding the branch metric "1" to the path metric "0" is set as the path metric of the next state A.

Similarly, at the time t1, two branches from the states A and C are input to the state B. Since the data value of the branch from the state A is (1,1) and the reception data series is (0,1), the branch metric of the branch results in "1". Moreover, since the data value of the branch from the state C is (0,0), the branch metric of the branch also results in "1". Similarly, in this case, since both the branch metrics are "1", path selection is not performed but the value "1" obtained by merely adding the branch metric "1" to the path metric "0" is set as the path metric of the next state B.

Similarly, at the time t1, two branches from the states B and D are input to the state C. Since the data value of the branch from the state B is (0,1) and the reception data series is (0,1), the branch metric of the branch results in "0". Moreover, since the data value of the branch from the state D is (1,0), the branch metric of the branch results in "2". Therefore, in this case, the value "0" obtained by selecting the path from the state B (that is, the path from the state D is disused) and adding the branch metric "0" to the path metric "0" of the state B is set as the path metric of the next state C.

Similarly, at the time t1, two branches from the states B and D are input to the state D. Since the data value of the branch from the state B is (1,0) and the reception data series is (0,1), the branch metric of the branch results in "2". Moreover, since the data value of the branch from the state D is (0,1), the branch metric of the branch results in "0". Therefore, in this case, the value "0" obtained by selecting the path from the state D (that is, the path from the state B is disused) and adding the branch metric "0" to the path metric "0" of the state D is set as the path metric of the next state D.

Hereafter similarly, by computing a path metric based on the received reception data at each of times t2 to t7 and selecting a path, it is possible to form the trellis diagram shown in FIG. 4.

As shown in FIG. 4, at the time t7, "1", "3", "3" and "3" are finally obtained as the path metrics of the states A, B, C, and D. In this case, since a state having the smallest path metric becomes the maximum-likelihood state, the state A becomes the maximum-likelihood state. Therefore, by performing tracing-back starting with the state A, the correct decoded data (1,0,1,0,1,0,0) is restored with the paths shown by a thick line.

Among the above-described Viterbi algorithms, the path selection by the computation of a path metric and the path-metric computation by the addition of branch metrics are normally referred to as an add compare select (ACS) operation which is realized by an exclusive ACS operation circuit. Moreover, the trellis diagram shown in FIG. 4 is formed by writing the path metric and the surviving paths in a memory referred to as a path memory whenever computing a path metric through the ACS operation.

In the case of a cellular radio communication system, transmission data is normally transmitted every predetermined data unit referred to as a frame. Therefore, the convolutional encoding is performed every frame so that. the convolutional encoding is completed within the frame. When decoding convolutionally encoded data by using the above-described Viterbi algorithms so that the decoding is completed within the frame, the memory length of the path memory serves as an important factor. This is because the Viterbi decoding has a feature that the decoding accuracy can be further improved as the distance for tracing-back is long, that is, as the memory length of the path memory is long. Actually, however, it prevents a receiver from being minimized to use a path memory with a memory length longer than the data length of the encoded data. Therefore, a path memory is normally used that has a length five to six times longer than the constraint length of convolutional encoding.

Thus, in the case of a Viterbi decoder for Viterbi-decoding encoded data by using a path memory having a memory length shorter than the data length of the encoded data, as shown in FIG. 5, when path information which is constituted with a path metric and selected path are fully accumulated in the path memory by normally performing the ACS operation for the memory length of the path memory, first transmission data D1 is decoded by performing tracing-back up to the length of the path memory with the maximum-likelihood state among the final states stored in the path memory as a start point. When the transmission data D1 can be decoded, the first-input path information is disused similarly to a first-in first-out (FIFO) memory. Then, the ACS operation is performed once, the path information obtained through the operation is input to the path memory, and tracing-back is performed up to the path memory length by using the maximum-likelihood state among final states as a start point to decode second transmission data D2. Hereafter, the same processing is repeated so as to decode the transmission data by performing the tracing-back for the path memory length whenever new path information is input to the path memory. After the reception data runs out the, transmission data is decoded by assuming that the reception data "00" is received, and by computing path information and similarly performing the tracing-back up to the path memory length.

Thus, a conventional Viterbi decoder secures a necessary decoding accuracy by performing the ACS operation, every time until the final transmission data Dn can be decoded and by performing the tracing-back up to the memory length of the path memory when the memory length of the path memory is shorter than the data length of the encoded data. However, the conventional Viterbi decoder has problems that processing becomes complex because it is necessary to perform the ACS operation every time and to perform tracing-back up to the memory length of the path memory and, thereby, the time required for processing increases, and it is impossible to decode reception data at a high speed.

SUMMARY OF THE INVENTION

In view of the foregoing, an object of this invention is to provide a Viterbi decoding apparatus and a Viterbi decoding method capable of improving the decoding accuracy and increasing the decoding speed compared to the case of a conventional apparatus and method.

The foregoing object and other objects of the invention have been achieved by the provision of a Viterbi decoding apparatus and a Viterbi decoding method in which: a tail bit constituted with a predetermined value of (k−1) bits is added to the tail of a predetermined-length data string and assuming the constraint length of a convolutional encoder as "k", the initial value of each register of the shift register of the convolutional encoder is set to a predetermined value and the data string to which the tail bit is added is convolutionally encoded with the convolutional encoder so that the symbol string is generated; when the symbol string is received and the data string is decoded from the symbol string, a path metric value weighted based on the initial value of each of the registers is set as the initial path metric value of each state, the path metric value of each state is successively computed on the basis of the initial path metric value whenever the symbol string is received so that surviving paths are stored in a path memory, the data string is decoded one bit by one bit whenever tracing-back is performed for the path memory length with a maximum-likelihood state determined based on the path metric value as a start-point state until the path metric operation reaches the number of data strings, and the data string is decoded one bit by one bit whenever tracing-back is performed for one step by using a fixed state determined based on the value of a tail bit as a start-point state when the path metric operation reaches the final operation for the symbol string.

Thus, the initial path metric value of each state is set to a value weighted based on the initial value of a convolutional encoder, and a data string is decoded one bit by one bit whenever tracing-back is performed for one step by using a fixed state determined by the value of a tail bit as a start-point state when the path metric operation reaches the final operation, thereby a path metric can be computed accurately and the tracing-back frequency can be reduced.

The nature, principle and utility of the invention will become more apparent from the following detailed description when read in conjunction with the accompanying drawings in which like parts are designated by like reference numerals or characters.

BRIEF DESCRIPTION OF THE DRAWINGS

In the accompanying drawings:

FIG. 9 is a diagram showing the data throughput of each block;

FIG. 12 is a chart explaining the hexadecimal soft decision data for constituting a reception symbol D6;

FIG. 13 is a chart explaining the tetradecimal soft decision data for constituting a reception symbol D25;

FIG. 15 is a chart showing initial path metric values of states;

FIG. 18 is a chart showing prospective states when the ACS operation frequency exceeds the number of convolutional data values.

DETAILED DESCRIPTION OF THE EMBODIMENT

Figure 1:
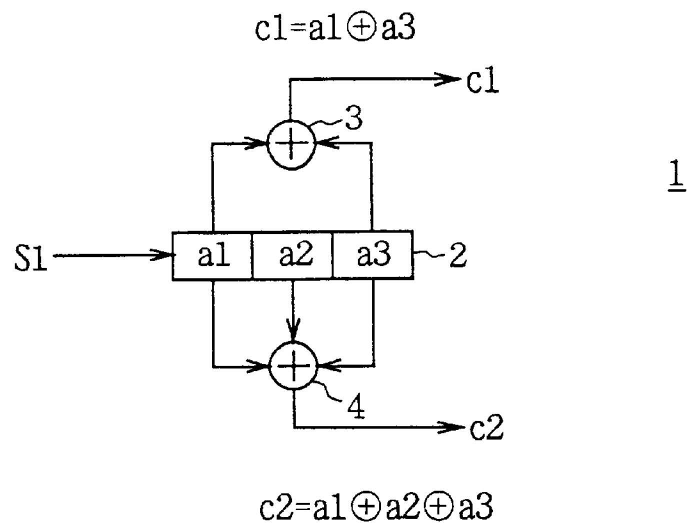
FIG. 1 is a block diagram showing the structure of a general convolutional encoder for explaining conventional Viterbi decoding.
Figure 2:
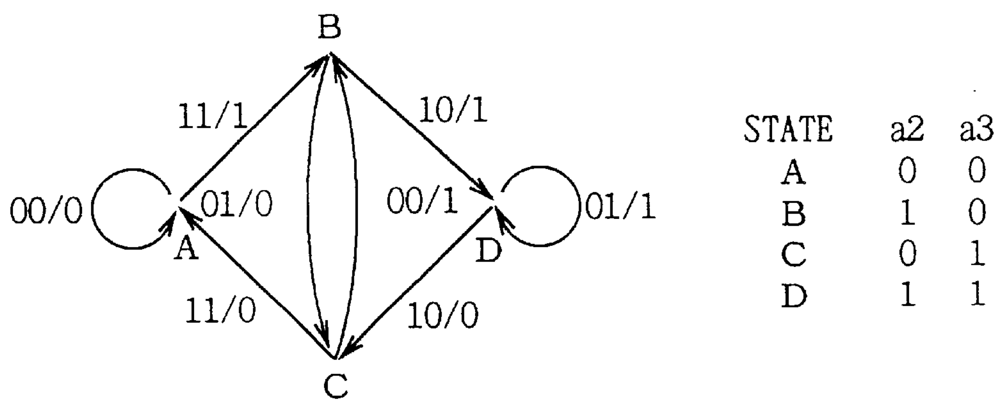
FIG. 2 is a state transition diagram explaining a state transition for convolutional encoding.
Figure 3:
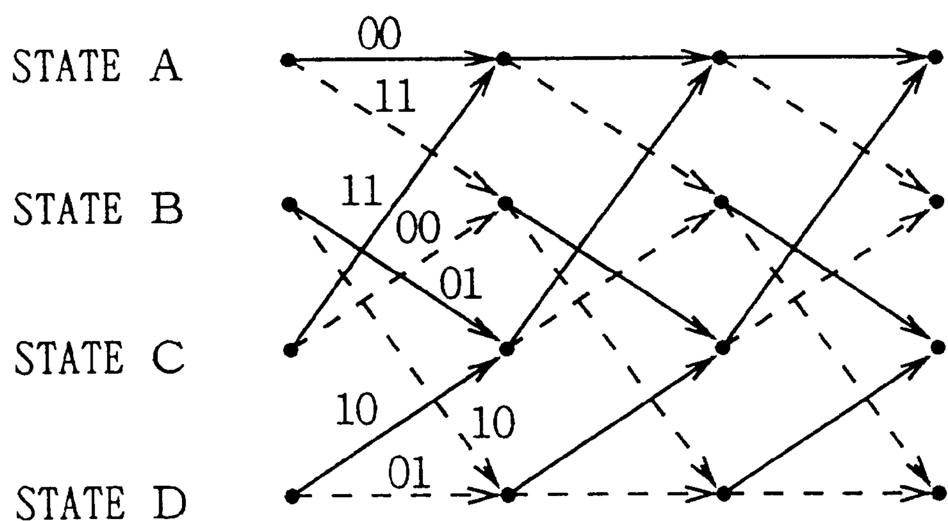
FIG. 3 is a trellis diagram obtained by developing the state transition diagram in the time direction.
Figure 4:
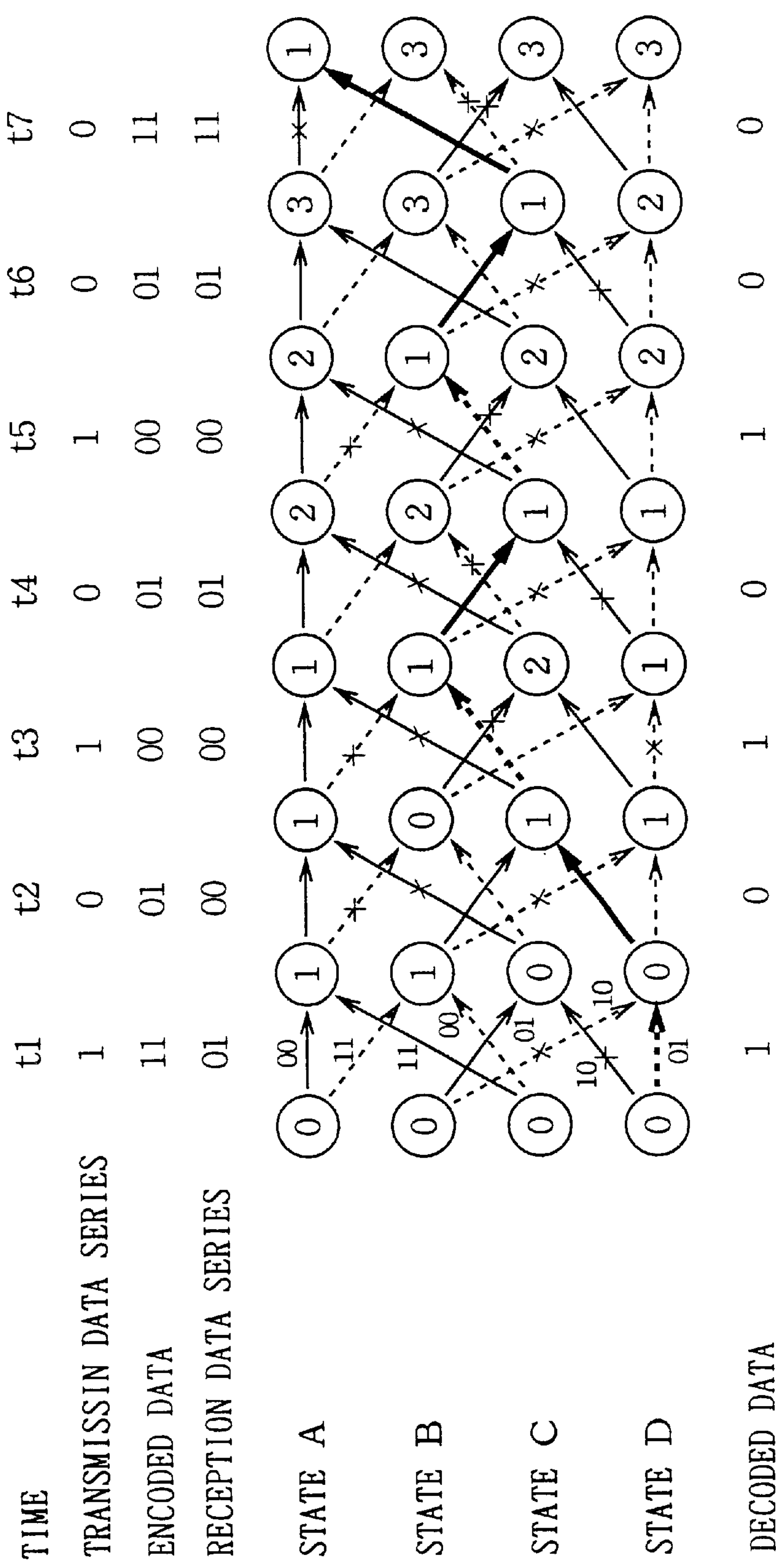
FIG. 4 is a trellis diagram explaining a conventional Viterbi-decoding algorithm.
Figure 5:
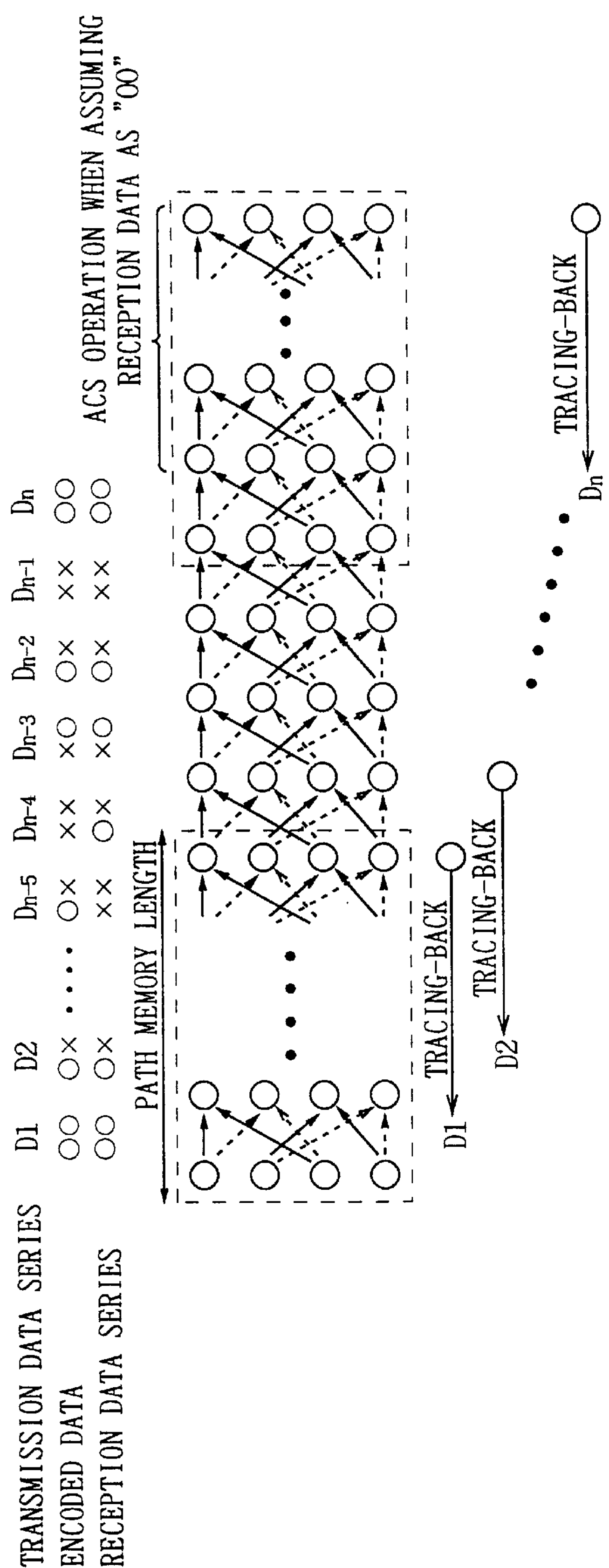
FIG. 5 is a schematic diagram explaining tracing-back in conventional Viterbi decoding.
Figure 6:
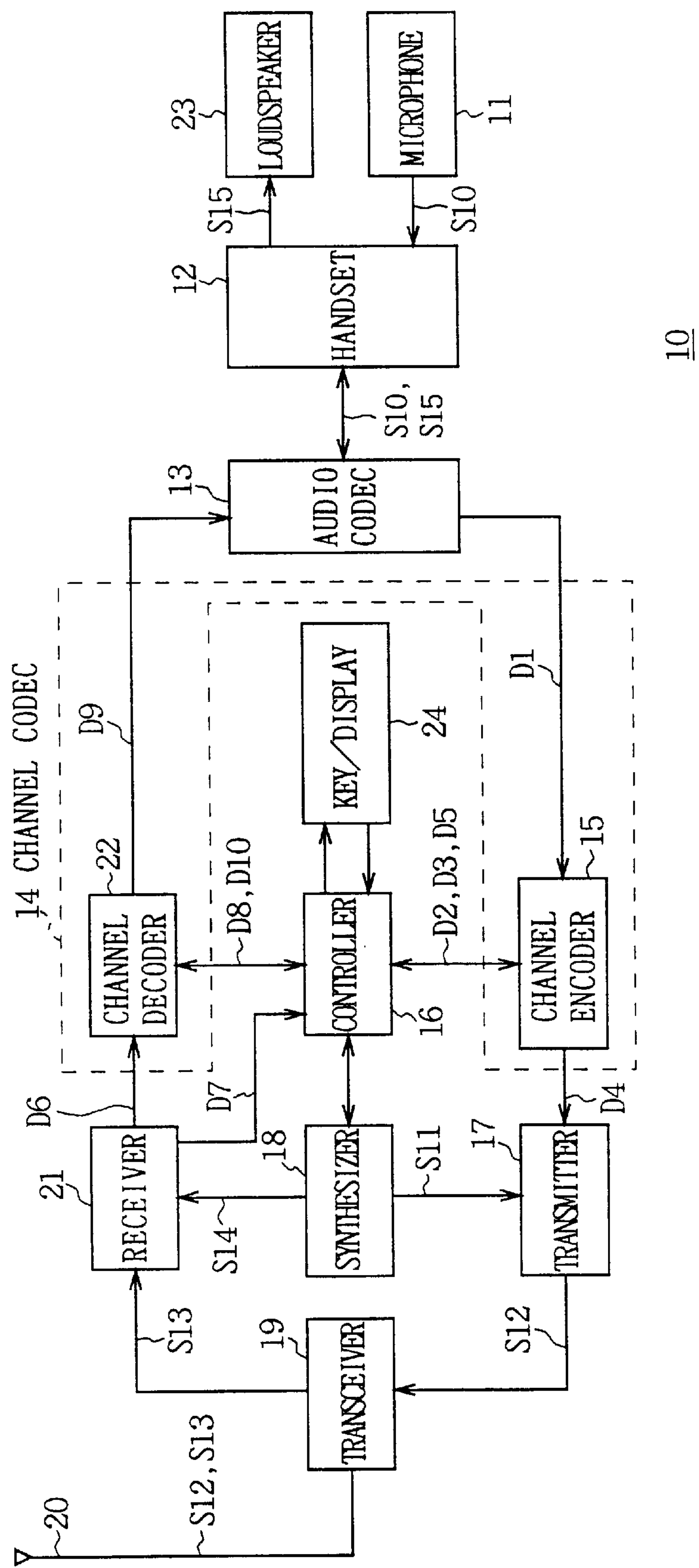
FIG. 6 is a block diagram showing the entire structure of a communication terminal unit to which the present invention is applied.

Preferred embodiments of the present invention will be described with reference to the accompanying drawings:

In FIG. 6, symbol 10 denotes, as a whole, a communication terminal unit of, for example, a CDMA-type cellular radio communication system to which the present invention is applied. The communication terminal unit 10 is connected with the base station (not illustrated) through the radio line so as to be able to transfer an audio signal to and from another communication terminal unit having the same structure as the terminal 10 via the base station. In the communication terminal unit 10, the voice of a user collected by a microphone 11 during conversation are converted into an audio signal S10 and transmitted to a handset 12, and the audio signal S10 is interface-converted by the handset 12 and transmitted to an audio codec 13.

The audio codec 13 digitizes the audio signal S10 at a data rate corresponding to a transmission rate of 9600 bps and transmits the audio data D1 thus obtained to a channel encoder 15 constituting a channel codec 14.

The channel encoder 15 convolutionally encodes audio data D1 based on control data D2 transmitted from a controller 16, interleaves the encoded data thus obtained, thereafter replaces a part of the encoded data with another control information data (e.g., control information data showing transmission power) D3 received from the controller 16 and transmits the transmission symbol D4 thus obtained to a transmitter 17.

The transmitter 17 receives a carrier signal S11 from a synthesizer 18, generates a transmission signal by applying a predetermined modulation to the transmission symbol D4 in accordance with the carrier signal S11 and moreover generates a transmission signal S12 by frequency-converting the transmission signal into a transmission band, and outputs the signal S12 to an antenna 20 through a transceiver 19. Thereby, the transmission signal S12 is transmitted to a base station (not illustrated) through the antenna 20.

Moreover, a signal transmitted from the base station is received by the antenna 20 and input to a receiver 21 through the transceiver 19 as a reception signal S13. In this connection, the reception signal S13 has the same format as that of the transmission signal S12 transmitted by the communication terminal unit 10 because the same processing as the transmission processing of the communication terminal unit 10 is applied to the signal S13. The receiver 21 fetches a base band signal by receiving a carrier signal S14 from the synthesizer 18 and frequency-converting the reception signal S13 in accordance with the carrier signal S14 and moreover fetches a digital reception symbol D6 by applying a predetermined decoding to the base band signal. In this connection, control information data D7 included in the reception symbol D6 is separated this time through replacement and transmitted to the controller 16.

A channel decoder 22 of the channel codec 14 restores audio data D9 sent via a base station by first applying information deletion to the portion of the reception symbol D6 where the control information data D7 is extracted, in accordance with control data D8 output from the controller 16 and thereafter, deinterleaving the reception symbol D6, and then Viterbi-decoding the reception symbol D6.

The audio codec 13 converts the audio data D9 output from the channel decoder 22 into an analog audio signal S15 and outputs the signal S15 to a loudspeaker 23 via the handset 12. Thereby, voices transmitted from the communication terminal unit of a companion are output from the loudspeaker 23 and thus, the audio conversation with the companion is established.

In this connection, the controller 16 generates communication control data D5 at the time of a call and the like to transmit the data D5 via the channel encoder 15 and transmitter 17, receives communication control data D10 transmitted from the base station via the channel decoder 22 to set, cancel, and maintain the call based on these communication control data D5 and D10, and executes the I/O control of a key/display 24. In addition to the above operations, the controller 16 controls the synthesizer 18 for generating the carrier signals S11 and S14 to control frequency bands for transmission and reception. Furthermore, the controller 16 controls the transmission power of the transmission signal S12 under transmission based on the control information data D7.

Figure 7:
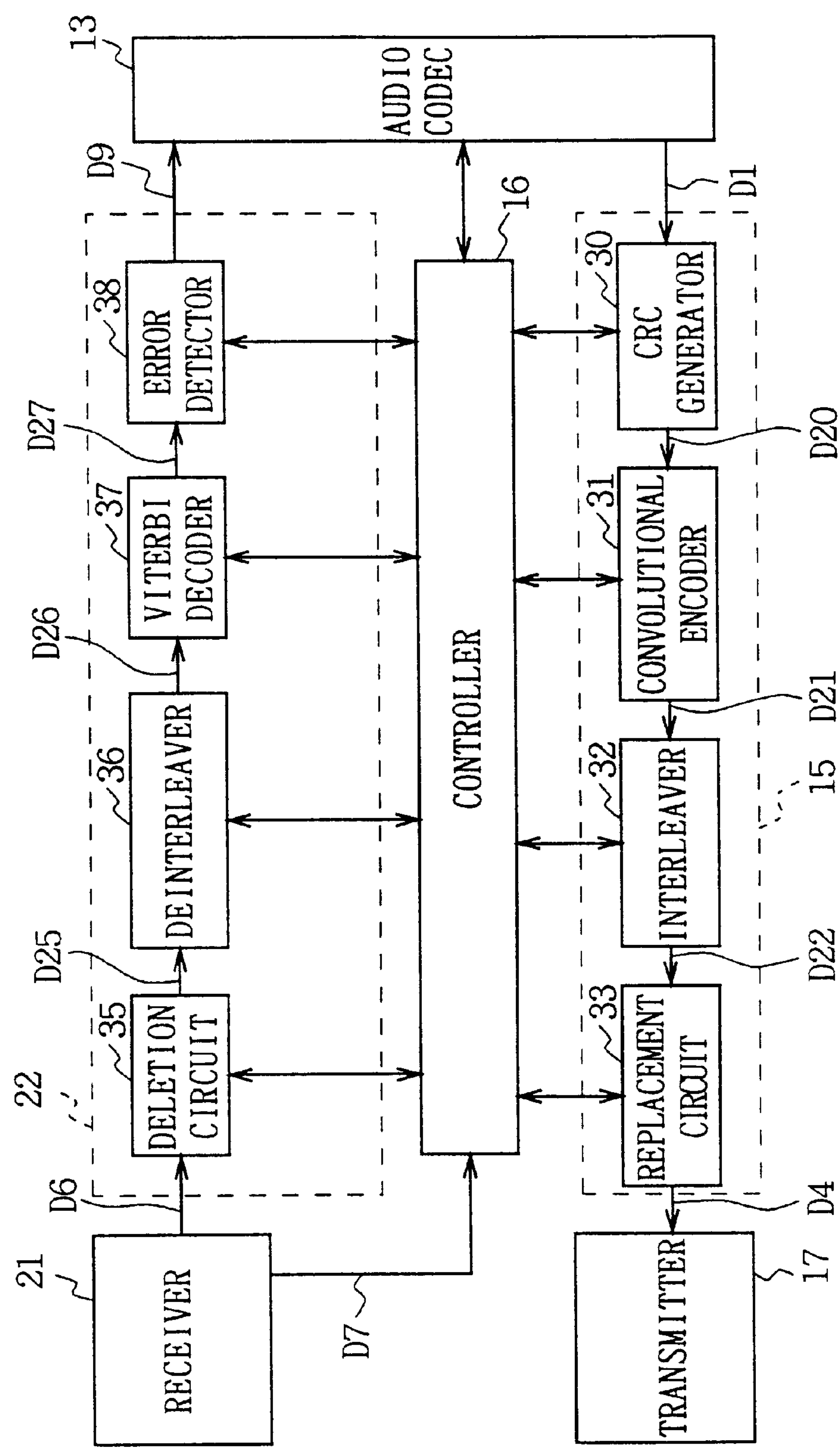
FIG. 7 is a block diagram showing the structure of a channel codec including a Viterbi decoder according to the present invention.

Here, the channel encoder 15 and channel decoder 22 constituting the channel codec 14 are specifically described by referring to FIG. 7 in which a portion corresponding to that in FIG. 6 is provided with the same symbol.

First, the audio data D1 output from the audio codec 13 is input to a CRC generator 30 of the channel encoder 15. The CRC generator 30 first generates transmission data D20 by adding a CRC code of predetermined bits to the audio data D1 of predetermined bits sent in frames under the control of the controller 16, and outputs the data D20 to a convolutional encoder 31. The convolutional encoder 31 adds a tail bit having a constraint length of k−1 bits to the tail of the transmission data D20 of predetermined bits sent in frames under the control of the controller 16 and then generates a transmission symbol D21 constituted with convolutional encoded data by applying the convolutional operation to the transmission data D20 and outputs the symbol D21 to an interleaver 32.

The interleaver 32 includes a memory, stores the transmission symbols D21 in the memory in a predetermined order under the control by the controller 16, generates transmission symbols D22 whose order is rearranged by reading the transmission symbols D21 from the memory in a order different from the order at the time of write operation, and outputs the transmission symbols D22 to a replacement circuit 33. The replacement circuit 33 replaces predetermined bits of the transmission symbols D22 with other control information data under the control of the controller 16 and transmits the transmission symbol D4 thus obtained to the transmitter 17.

On the other hand, the reception symbol D6 output from the receiver 21 is first input to a deletion circuit 35 of the channel decoder 22. The deletion circuit 35 replaces a part of data deleted through extraction of the control information data D7 by the receiver 21 with deletion data showing a part where data has been deleted under the control of the controller 16, and outputs a reception symbol D25 thus obtained to a deinterleaver 36. The deinterleaver 36 includes a memory, stores the reception symbol D25 in the memory in a predetermined order under the control by the controller 16, restores the data order rearranged at the transmission side to the original order by reading the reception symbols D25 in an order different from the order at the time of the write operation, and outputs a reception symbol D26 thus obtained to a Viterbi decoder 37.

The Viterbi decoder 37 decodes audio data from the reception symbol D26 by using a Viterbi algorithm, which decodes audio data D27 sent via the base station by Viterbi-decoding the reception symbol D26 under the control of the controller 16 and outputs the data D27 to an error detector 38. The error detector 38 fetches a CRC code added to the audio data D27 under the control of the controller 16, detects errors in the audio data D27 based on the CRC code, and communicates an error if any to the audio codec 13 via the controller 16. Moreover, the error detector 38 outputs the audio data left after fetching the CRC code to the audio codec 13 as the audio data D9.

Figure 8:
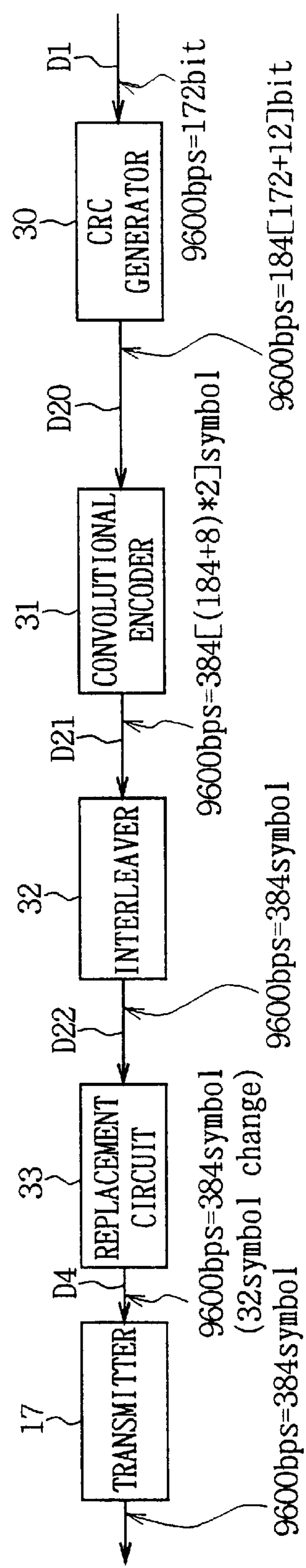
FIG. 8 is a block diagram for explaining the data throughput of each block of the channel codec.
Figure 10:
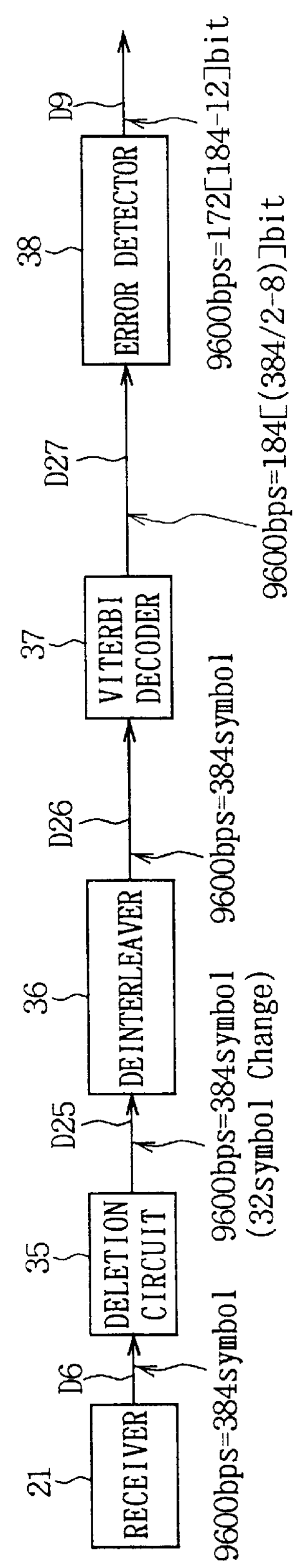
FIG. 10 is a block diagram explaining the data throughput of each block of the channel codec.

Here, the data throughputs by the channel encoder 15 and channel decoder 22 are specifically described by referring to FIGS. 8 to 10. In the communication terminal unit 10, time intervals having a cycle of 20 milliseconds, that is, frames are formed, and each data processing is performed in frames. Thereby, data is finally transmitted at 9600 bps.

As shown in FIGS. 8 and 9, the audio data D1 of 172 bits is output from the audio codec 13 every frame. The CRC generator 30 generates the transmission data D20 of 184 bits per frame by adding a CRC code of twelve bits generated in accordance with the generator polynomial shown as the following equation (1) to the audio data D1 of 172 bits per frame and outputs the data D20 to the convolutional encoder 31.

$$G(X)=X^{12}+X^{11}+X^{10}+X^{9}+X^{8}+X^{4}+X+1 \quad (1)$$

The convolutional encoder 31 first generates transmission data of 192 bits per frame by adding eight tail bits constituted with a value "0" to the tail of the transmission data D20 of 184 bits per frame and then generates a transmission symbol D21 of 384 symbols per frame by applying the convolutional operation with a constraint length k=9 and an encoding rate R=½ to the transmission data.

The interleaver 32 rearranges the transmission symbols D21 of 384 symbols per frame so as to be completed within the frame and outputs thus obtained transmission symbols D22 of 384 symbols per frame to the replacement circuit 33. The replacement circuit 33 replaces the transmission symbols D22 of 384 symbols per frame with another control information data D3 at a rate of one symbol per twelve symbols and outputs thus obtained transmission symbols D4 of 384 symbols per frame to the transmitter 17. In this case, since information bits of 192 bits obtained by adding the CRC code and the tail bit for each frame (20 milliseconds) are transmitted, a transmission rate of 9600 (=192×1/0.02) bps is realized.

Moreover, as shown in FIG. 10, reception symbols D6 of 384 symbols are output from the receiver 21 every frame. The deletion circuit 35 replaces 32 symbols deleted through the extraction by the receiver 21 among the reception symbols D6 of 384 symbols per this frame with other deletion symbols and outputs thus obtained reception symbols D25 of 384 symbols per frame to the deinterleaver 36. Moreover, in this case, the reception symbols D6 output from the receiver 21 are formed with hexadecimal soft decision data in which one symbol is constituted with four bits.

The deinterleaver 36 rearranges the reception symbols D25 of 384 symbols per frame so as to be completed within the frame and returns the symbols D25 in the original order and outputs thus obtained reception symbols D26 of 384 symbols per frame to the Viterbi decoder 37. The Viterbi decoder 37 applies the maximum-likelihood decoding with a constraint length k=9 and an encoding rate R=½ to the reception symbols D26 of 384 symbols per frame by using a Viterbi algorithm and outputs thus obtained audio data D27 of 184 bits per frame to the error detector 38. In this case, however, the eight tail bits added at the time of transmission are not output. The error detector 38 fetches the CRC code of twelve bits from the audio data D27 of 184 bits per frame to perform error detection and outputs thus obtained audio data D9 of 172 bits per frame to the audio codec 13.

Figure 11:
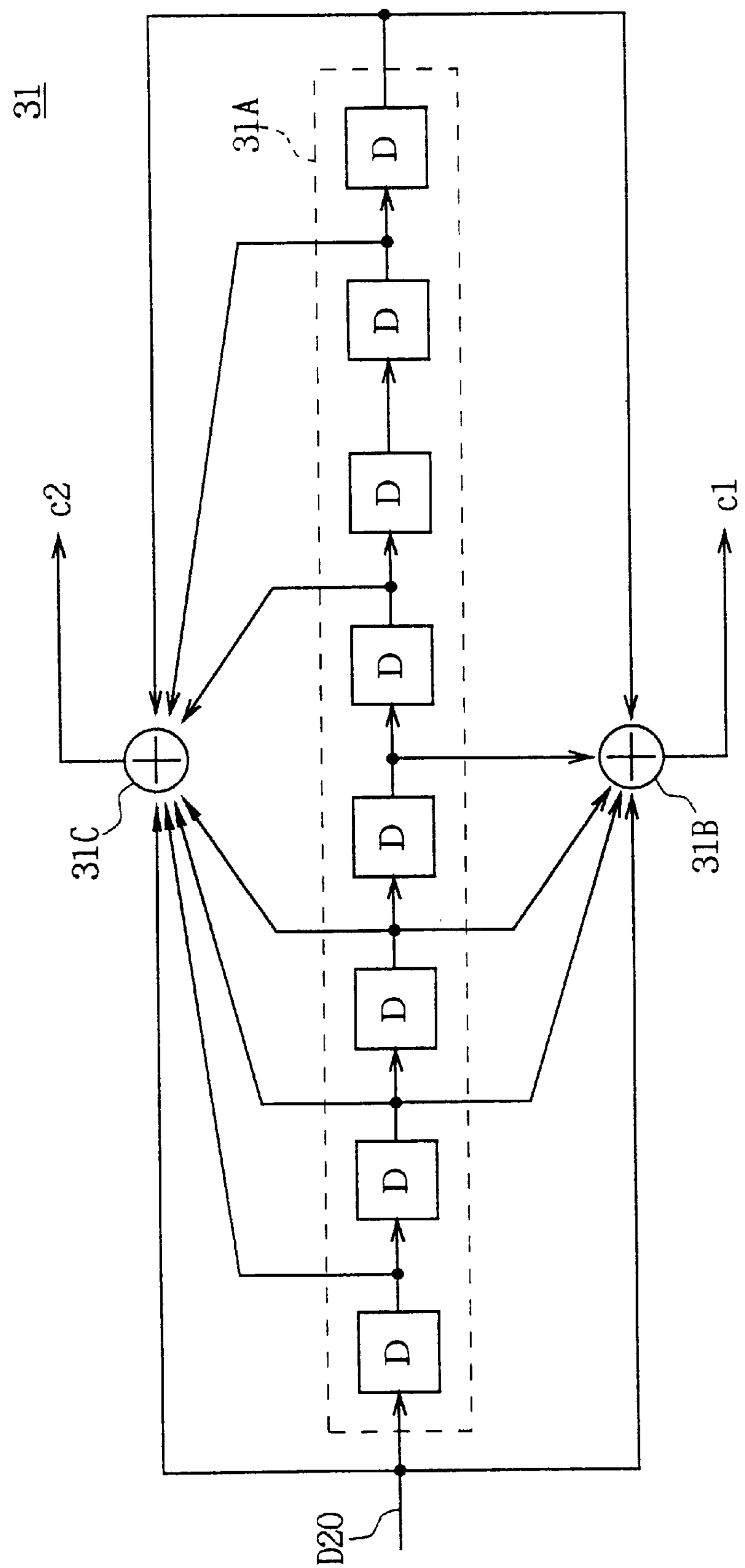
FIG. 11 is a block diagram showing the structure of a convolutional encoder provided for a channel codec.

FIG. 11 shows the convolutional encoder 31 provided in the above-described channel encoder 15. As shown in FIG. 11, the convolutional encoder 31 is constituted with a shift register 31A having eight stages and first and second exclusive OR circuits 31B and 31C for performing an exclusive OR operation on the values of predetermined stages of the shift register. In this case, the first exclusive-OR circuit 31B outputs first encoded data cl by performing the exclusive OR operation on a value input to a first register and values output from second, third, fourth, and eighth registers. The second exclusive-OR circuit 31C outputs second encoded data c2 by performing the exclusive OR operation on a value input to the first register and values output from the first, second, third, fifth, seventh, and eighth registers. Thus, the convolutional encoder 31 generates the transmission symbols D21 by outputting the encoded data c1 and c2 whenever one bit of the transmission data D20 is input.

In this connection, though the shift register 31A has eight stages, the constraint length k is set to "9" because the value of an input stage is also used. Moreover, since the transmission symbol D21 of two bits is output whenever one bit of the transmission data D20 is input, the encoding rate R is set to "½".

The convolutional encoder 31 starts the convolutional operation by resetting the shift register 31A at the beginning of each frame and thereby, setting the initial value of each register of the shift register 31 to "0". Moreover, when input of the transmission data D20 of 184 bits for one frame is completed, a constraint length of k−1 bits, that is, eight pieces of "0" are input as tail bits. Thereby, the transmission symbols D21 of 384 symbols per frame are generated.

Then, the structure of the Viterbi decoder 37 to which the present invention is applied and its Viterbi algorithm are specifically described below. As described above, the reception symbol D6 of the hexadecimal soft decision data in which one symbol is expressed by four bits is output from the receiver 21. As shown in FIG. 12, the hexadecimal soft decision data shows the polarity of the symbol with the most-significant bit (bit3) (that is, whether the data value shown by the symbol is set to "0" or "1") and shows the reliability with low-order three bits (bit2 to bit0). Note that, in the case where the polarity is set to "0", it is shown that the reliability is the highest when low-order three bits are set to "111" and is the lowest when the low-order three bits are set to "000". Furthermore, in the case where the polarity is set to "1", it is shown that the reliability is the highest when low-order three bits are set to "000" and is the lowest when the low-order three bits are set to "111".

In this connection, the metrics BM0 and BM1 shown at the leftmost positions of FIG. 12 respectively show the likelihood that each symbol has a polarity "0" and the likelihood that each symbol has a polarity "1". In this case, the metrics BM0 and BM1 are expressed in sixteen levels by assuming a value "0" as the maximum likelihood. Therefore, for example, a symbol constituted with "0111" has the highest reliability that the polarity is "0", so that the metrics BM0 and BM1 are expressed by "0" and "F" respectively. Moreover, a symbol constituted with "1000" has the highest reliability that the polarity is "1", so that the metrics BM0 and BM1 are expressed by "F" and "0" respectively.

The reception symbol D6 constituted with the hexadecimal soft decision data is input to the deletion circuit 35 where the data is deleted. In this case, to show a portion at which data is deleted through the control-information data extraction by the receiver 21, the deletion circuit 35 replaces the data at the portion with deletion data constituted with "0000".

Therefore, the reception symbol D25 output from the deletion circuit 35 results in the tetradecimal soft decision data as shown in FIG. 13. That is, in this case, since "0000" showing a symbol having a polarity "0" and the lowest reliability is assigned to deletion data, "1000" showing a symbol having a polarity "1" and the highest reliability cannot be used and resultantly, polarities "0" and "1" have to be expressed by the remaining fourteen kinds of values. Therefore, the reception symbol D25 output from the deletion circuit 35 is converted by the circuit 35 so that the reliability becomes highest when low-order three bits (bit2 to bit0) are set tho "111" and lowest when the low-order three bits are set to "001" by expressing a polarity "0" with the most-significant bit (bit3) and moreover, the reliability becomes highest when the low-order three bits are set to "001" and lowest when the low-order three bits are set to "111" by expressing a polarity "1" with the most-significant bit.

In this case, it is a matter of. course that the metrics BM0 and BM1 are also expressed in fourteen levels and show that a value "0" has the highest likelihood and a value "D" has the lowest likelihood. In this connection, in the case of information-deletion data, the metrics BM0 and BM1 are both set to a value "0" in order to separate the information-deletion data from other data.

Thus, the reception symbol D25 constituted with tetradecimal soft decision data passes through the deinterleaver 36 and then, it is input to the Viterbi decoder 37 as the reception symbol D26.

Figure 14:
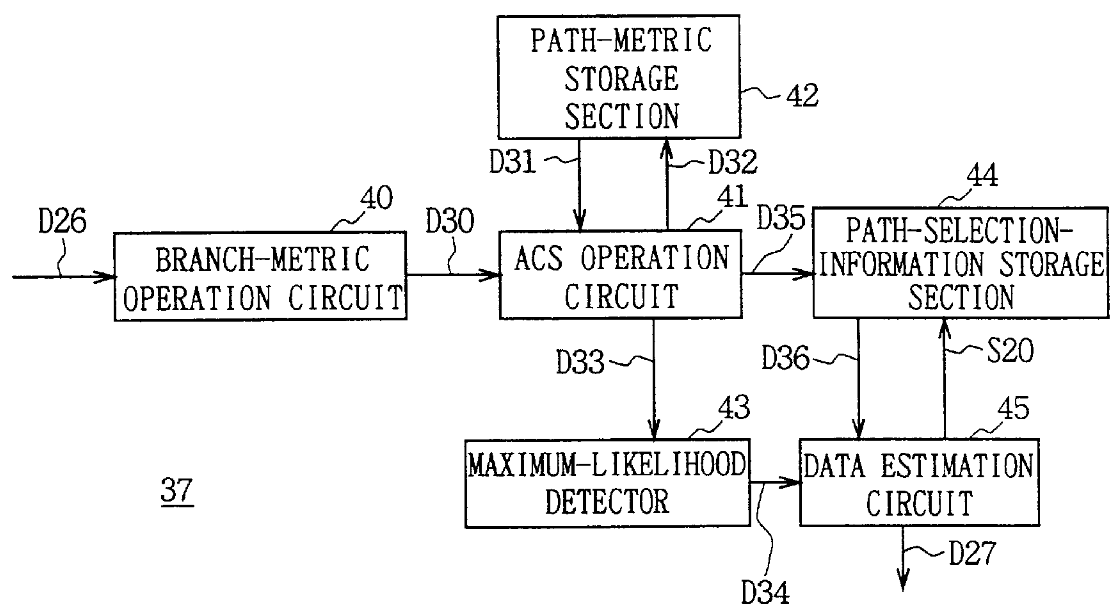
FIG. 14 is a block diagram showing the structure of a Viterbi decoder.

The Viterbi decoder 37, as shown in FIG. 14, is constituted with a branch metric operation circuit 40, an add-compare-select (ACS) operation circuit 41, a path metric storage section 42, a maximum-likelihood detector 43, a path-selection-information storage section 44, and a data estimation circuit 45 so as to first input the reception symbol D26 supplied from the deinterleaver 36 in the branch metric operation circuit 40.

The branch metric operation circuit 40 receives the reception symbol D26 constituted with the tetradecimal soft decision data shown in FIG. 13 and obtains the above metrics BM0 and BM1 for each symbol based on a four-bit value forming each symbol of the reception symbol D26. Moreover, since the encoding rate R is equal to ½, the branch metric operation circuit 40 computes the likelihood that two consecutive symbols of the reception symbol D26 are (0,0), (0,1), (1,0), and (1,1), that is, computes branch metrics BM(0,0), BM(0,1), BM(1,0), and BM(1,1), based on the metrics BM0 and BM1.

The branch metric operation is specifically described below. For example, when assuming that two consecutive symbols are A and B and the metrics BM0 and BM1 of the symbols are BM0(A) and BM1(A), and BM0(B) and BM1 (B) respectively, the branch metric operation circuit 40 computes branch metrics BM(0,0), BM(0,1), BM(1,0), and BM(1,1) in which the two symbols A and B are (0,0), (0,1), (1,0), and (1,1) in accordance with the operation shown by the following equation (2).

$$\left.\begin{aligned} BM(0,0) &= BM0(A) + BM0(B) \\ BM(0,1) &= BM0(A) + BM1(B) \\ BM(1,0) &= BM1(A) + BM0(B) \\ BM(1,1) &= BM1(A) + BM1(B) \end{aligned}\right\} \tag{2}$$

Thus, the branch metric operation circuit 40 performs the operation shown by the equation (2) whenever two reception symbols D26 are input, computes branch metrics BM(0,0), BM(0,1), BM(1,0), and BM(1,1) for the two symbols, and outputs these branch metrics to the ACS operation circuit 41 as branch data D30.

The ACS operation circuit 41 is a circuit for computing the path metric of each state in accordance with a trellis diagram. In this case, since the constraint length k of convolutional encoding is set to "9", 256 independent states are present as shown by the following equation (3).

$$\begin{aligned} \text{The number of states} &= 2^{(k-1)} \\ &= 2^{(9-1)} \\ &= 256 \end{aligned} \tag{3}$$

The ACS operation circuit 41 first obtains the path metrics of two paths input to each state at the present time based on a branch metric provided as the branch data D30 and the last-time path metric of each state read from the path metric storage section 42 as path data D31, selects the maximum-likelihood path input to each state based on the above path metrics, and stores the selected path metric in the path metric storage section 42 as the path data D32 by assuming the selected path metric as the present-time path metric of each state.

Here, a specific example of the above operation is described. It is possible to express 256 states as state 00 to state FF by using two-digit hexadecimal numbers. For the state 00 among the above states, the following two paths are present: a first path "a" input from the state 00 through the branch (0,0); and a second path "b" input from the state 80 through the branch (1,1). In this case, path metrics S00 (new)a and S00(new)b of the first and second paths "a" and "b" are obtained from path metrics S00(old) and S80(old) of the last-time state 00 and state 80 and the branch metrics BM(0,0) and BM(1,1) of the branch (0,0) and branch (1,1). Therefore, the ACS operation circuit 41 performs the operation shown by the following equation (4) with the branch metrics BM(0,0) and BM(1,1) provided by the branch data D30 and the path metrics S00(old) and S80(old) provided by the path data D31 to obtain the path metrics S00(new)a and S00(new)b of each path.

$$\left.\begin{aligned} S00(new)a &= S00(old) + BM(0,0) \\ S00(new)b &= S80(old) + BM(1,1) \end{aligned}\right\} \tag{4}$$

Then, the ACS generation circuit 41 selects either the first or second path "a" or "b" which has a smaller path metric as a maximum-likelihood path by making the decision shown by the following equation (5) with the values of the path metrics S00(new)a and S00(new)b.

$$\left.\begin{aligned} &\text{if } (S00(new)a < S00(new)b) \\ &S00(new) = S00(new)a, \\ &\text{else} \\ &S00(new) = S00(new)b \end{aligned}\right\} \tag{5}$$

Then, the ACS operation circuit 41 uses the path metric of the path selected as the maximum-likelihood path as the path metric of the state 00 at the present time.

Thus, the ACS operation circuit 41 computes the path metric of each state at the present time by performing the above processing for each state and stores each path metric in the path metric storage section 42 as the path data D32.

Moreover, the ACS operation circuit 41 outputs the path metric of each state at the present time to the maximum-likelihood detector 43 as path data D33. Thereby, the maximum-likelihood detector 43 detects the maximum-likelihood state out of all states at the present time based on the path data D33 and outputs the state number showing the maximum-likelihood state to the data estimation circuit 45 as maximum-likelihood state information D34.

Furthermore, the ACS operation circuit 41 outputs the path selection information D35 showing a path selected from two paths input to each state (the path selection information also includes the path metrics) to the path-selection-information storage section 44. The path-selection-information storage section 44 is a memory referred to as a path memory that stores surviving paths by successively storing the path selection information D35 at each time. Moreover, the number of storage stages (that is, path memory length) of the path-selection-information storage section 44 is set to approximately 64.

The data estimation circuit 45 determines a state serving as the start point for tracing-back based on the maximum-likelihood information D34 output from the maximum-likelihood detector 43 when data is accumulated in the path-selection-information storage section 44 up to a predetermined quantity, selects maximum-likelihood decoded data by outputting a read signal S20 to the path-selection-information storage section 44 to successively obtain path selection information D36 and thereby, successively performing tracing-back starting with the start-point state to follow up surviving paths, and outputs the maximum-likelihood decoded data as audio data D27.

In the Viterbi decoder 37 having the above structure, the roughly-divided following three processes are performed so as to improve the accuracy of the Viterbi decoding characteristic and the processing speed. As the first processing, the initial value of the path metric of each state is weighted taking the convolutional characteristic into consideration. In the convolutional encoder 31 shown in FIG. 11, the initial value of each register of the eight-stage shift register 31A is set to "0", so that this is equivalent to the case of adding "0"

having a constraint length of k−1 bits to the head of the transmission data D20. Considering the above mentioned, it is possible to make the value of a path metric accurate by previously setting the initial path metric of each state to a path metric when data "0" is consecutively input and performing the ACS operation starting with the path metric. Based on the above idea, as shown in FIG. 15 the Viterbi decoder 37 is constituted so as to previously compute the path metric of each state when data "0" is consecutively input and to set the path metric as the initial value of each state. Moreover, as the second processing, when the final ACS operation is completed, that is, when the final reception symbol is received, data is decoded whenever tracing-back is performed by one step. In this case, a start-point state is set to the state 00 instead of being set to the maximum-likelihood state according to the ACS operation. Since the convolutional encoder 31 shown in FIG. 11 performs convolutional operation by adding a tail bit constituted with a value "0" having a constraint length of k−1 bits to the tail of the transmission data D20, the final ideal state should be the state 00. Therefore, when the Viterbi decoder 37 receives the final reception symbol, it performs tracing-back by using the ideal state 00 which can be originally obtained as a start point instead of using the maximum-likelihood state obtained through the ACS operation as the start point.

Moreover, the third processing is to restrict prospective states for selecting a maximum-likelihood state to states determined by values of tail bits even from the (final ACS operation-1)th time up to the (1 final ACS operation-{(k−1)−1})th time. The convolutional encoder 31 shown in FIG. 11 performs the conventional operation by adding the value "0" of a constraint length of k−1 bits (in the case of this embodiment, eight bits because of k=9) to the tail of the sending data D20. Therefore, prospective states from the (final ACS operation-1)th time up to the (final ACS operation-7)th time sould originally be prospective states determined by the value "0" of the tail bit. Thus, during this operation, a maximum-likelihood state is selected out of the restricted prospective states. In this case, FIG. 18 shows the prospective states: two states of 00 and 80 are considered when the ACS operation is the (final ACS operation-1)th time; and four states of 00, 40, 80, and C0 are considered when the ACS operation is the (final ACS operation-2)th time. Hereafter similarly, the states shown in FIG. 18 are considered in accordance with the ACS-operation frequency.

Figure 16:
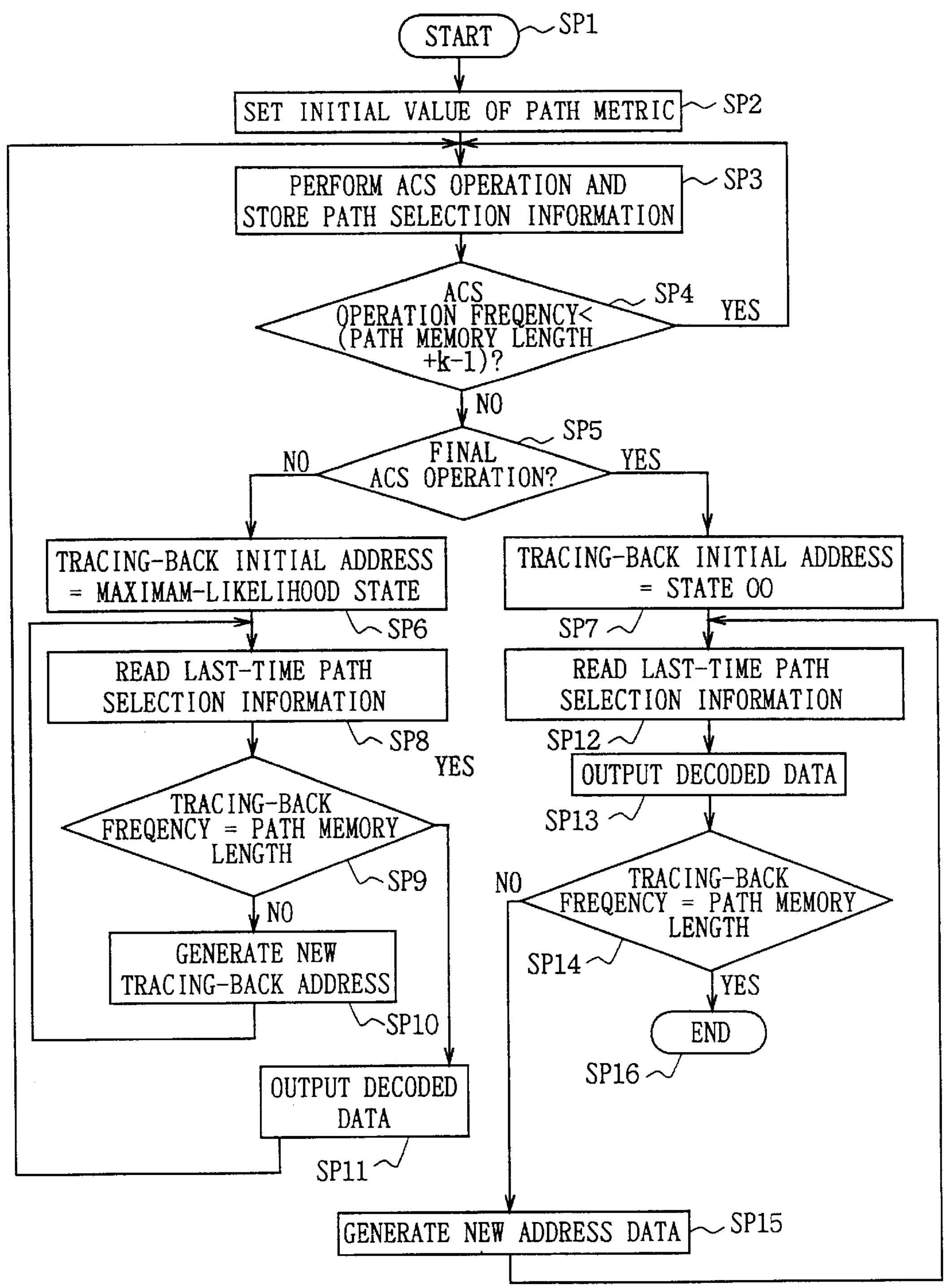
FIG. 16 is a flowchart showing an algorithm for Viterbi decoding according to the present invention.

FIG. 16 shows a decoding algorithm of the Viterbi decoder 37 adding the above-described first and second processes. As shown in FIG. 16, the Viterbi decoder 37 first sets the initial value of the path metric of each state to a weighted value shown in FIG. 15 in the step SP2 following the step SP1. Specifically, the decoder 37 sets initial path metrics of the states to be stored in the path-metric storage section 42 to the values shown in FIG. 15.

Then, in the next step SP3, the Viterbi decoder 37 performs the ACS operation based on the reception symbol D26 and stores the path selection information D35 by selecting a path in accordance with the ACS operation. Specifically, the branch-metric operation circuit 40 first computes the branch metrics BM(0,0), BM(0,1), BM(1,0) and BM(1,1) of two symbols input as the reception symbols D26. Then, the ACS operation circuit 41 computes the path metric of each path considerable at the present time based on the above branch metrics and the last-time path metrics stored in the path-metric storage section 42 to select the maximum-likelihood path of each state and moreover, stores the path metrics of the selected maximum-likelihood paths in the path-metric storage section 42 and furthermore, stores the path selection information D35 showing the selected path in the path-selection-information storage section 44.

Then in the next step SP4, the Viterbi decoder 37 decides whether the ACS-operation frequency is equal to (path memory length+k−1) times or less. When the ACS-operation frequency is less than the reference value, the processing in the step SP3 is repeated. When the ACS-operation frequency reaches the reference value, the step SP5 is started. The above decision is made by, for example, the data estimation circuit 45 by counting the output frequency of the maximum-likelihood-state information D34. Moreover, in the case of this embodiment, a reference value is determined as (path memory length+8) times because the constraint length k is set to "9".

Then, in the next step SP5, the Viterbi decoder 37 decides whether the ACS operation performed at present is the final ACS operation for the reception symbol D26 or not. When the ACS operation performed at present is not the final ACS operation, the step SP6 is started. When the former ACS operation is the final ACS operation, the step SP7 is started. The above decision is also made by, for example, the data estimation circuit 45.

In the step SP6, the Viterbi decoder 37 sets the initial address for tracing-back to the maximum-likelihood state. That is, the data estimation circuit 45 sets the start-point state for tracing-back to the maximum-likelihood state detected by the maximum-likelihood detector 43.

Then in the next step SP8, the data estimation circuit 45 of the Viterbi decoder 37 reads the path selection information D36 one time before from the path-selection-information storage section 44 to perform tracing-back by one step. In the next step SP9, the data estimation circuit 45 decides whether the step frequency for tracing-back is equal to a path memory length or not. When the step frequency is not equal to the path memory length, the step SP10 is started. However, if the step frequency is equal to the path memory length, the step SP11 is started.

In the step SP10, the data estimation circuit 45 generates a new address for tracing-back based on the tracing-back performed just before and repeats the processing in the step SP8. That is, the data estimation circuit 45 sets the end-point state for the tracing-back performed just before as a start-point this time and performs tracing-back again in the step SP8.

On the other hand, in the step SP11, the data estimation circuit 45 decides that tracing-back is performed by the path memory length, estimates the received data for one bit based on a finally reached state and outputs the data as decoded data. When the processing is completed, the Viterbi decoder 37 returns to the step SP3 to repeats the processing.

On the contrary, when the step SP7 is started after the step SP5 because of the final ACS operation, the data estimation circuit 45 sets the initial address for tracing-back to the state 00 instead of setting it to the maximum-likelihood state detected by the maximum-likelihood detector 43.

In the next step SP12, the data estimation circuit 45 reads the path selection information D36 one time before from the path-selection-information storage section 44 to perform tracing-back by one step. In the next step SP13, the data estimation circuit 45 estimates the received data for one bit based on the state reached through the above tracing-back of one step and outputs the data as decoded data. Then in the step SP14, the data estimation circuit 45 decides whether the step frequency for tracing-back is equal to the path memory length or not. When the step frequency is not equal to the path memory length, the step SP15 is started. When the step frequency is equal to the path memory length, the circuit 45 decides that all received data is decoded and moves to the step SP16 to complete the processing.

In the step SP15, the data estimation circuit 45 generates a new address for tracing-back based on the one-step tracing-back performed just before and repeats the processing in the step SP12. That is, the data estimation circuit 45 sets the end-point state of the tracing-back performed just before as a start-point state this time and performs the tracing-back again in the step SP12. Thus, by executing the above Viterbi algorithm, the Viterbi decoder 37 successively decodes data from the reception symbol D26.

The communication terminal unit 10 having the above structure sets the value of each register of the convolutional encoder 31 to "0" under transmission, performs convolutional encoding by adding a tail bit having a constraint length of k−1 bits constituted with a value "0" to the tail of the transmission data D20 formed in frames, and transmits the transmission symbol D21 thus obtained via the interleaver 32 and transmitter 17.

On the other hand, under reception, the communication terminal unit 10 receives a symbol generated through the same processing as the above transmission, through the receiver 21, the deinterleaver 36 and the like and inputs the reception symbol D26 to the Viterbi decoder 37 to decode received data. In this case, the Viterbi decoder 37 sets the initial path metric of each state to be stored in the path-metric storage section 42 to a weighted value by noticing that each register value of the convolutional encoder 31 is initially set to "0" and successively starts the ACS operation under the above state to compute a path metric and select a path. Then, the Viterbi decoder 37 decodes data one bit by one bit whenever the tracing-back for a path memory length is completed by using the maximum-likelihood state having the minimum path metric value as a start point, until performing the final ACS operation for the reception symbol D26. When performing the final ACS operation, the Viterbi decoder 37 decodes data one bit by one bit whenever performing tracing-back by one step by using the state 00 specified by a tail bit as a start point.

Thus, the Viterbi decoder 37 sets the initial path metric value of each state to a value weighted based on the initial value of each register of the convolutional encoder 31 instead of uniformly setting the initial path metric values of the states. Therefore, it is possible to make the value of a path metric more accurate than before and improve the Viterbi decoding characteristic by performing decoding more accurately. Moreover, the Viterbi decoder 37 decodes data one bit by one bit whenever performing tracing-back by one step by using the state 00 determined by the value of the tail bit added for convolutional encoding as a start-point state when the path metric operation becomes the final operation for the reception symbol D26. Therefore, it is possible to reduce the number of steps for tracing-back compared to the conventional case of performing tracing-back by a path memory length every time, increase the decoding speed, perform trace-back from original ideal state and further accurately perform decoding.

Figure 17:
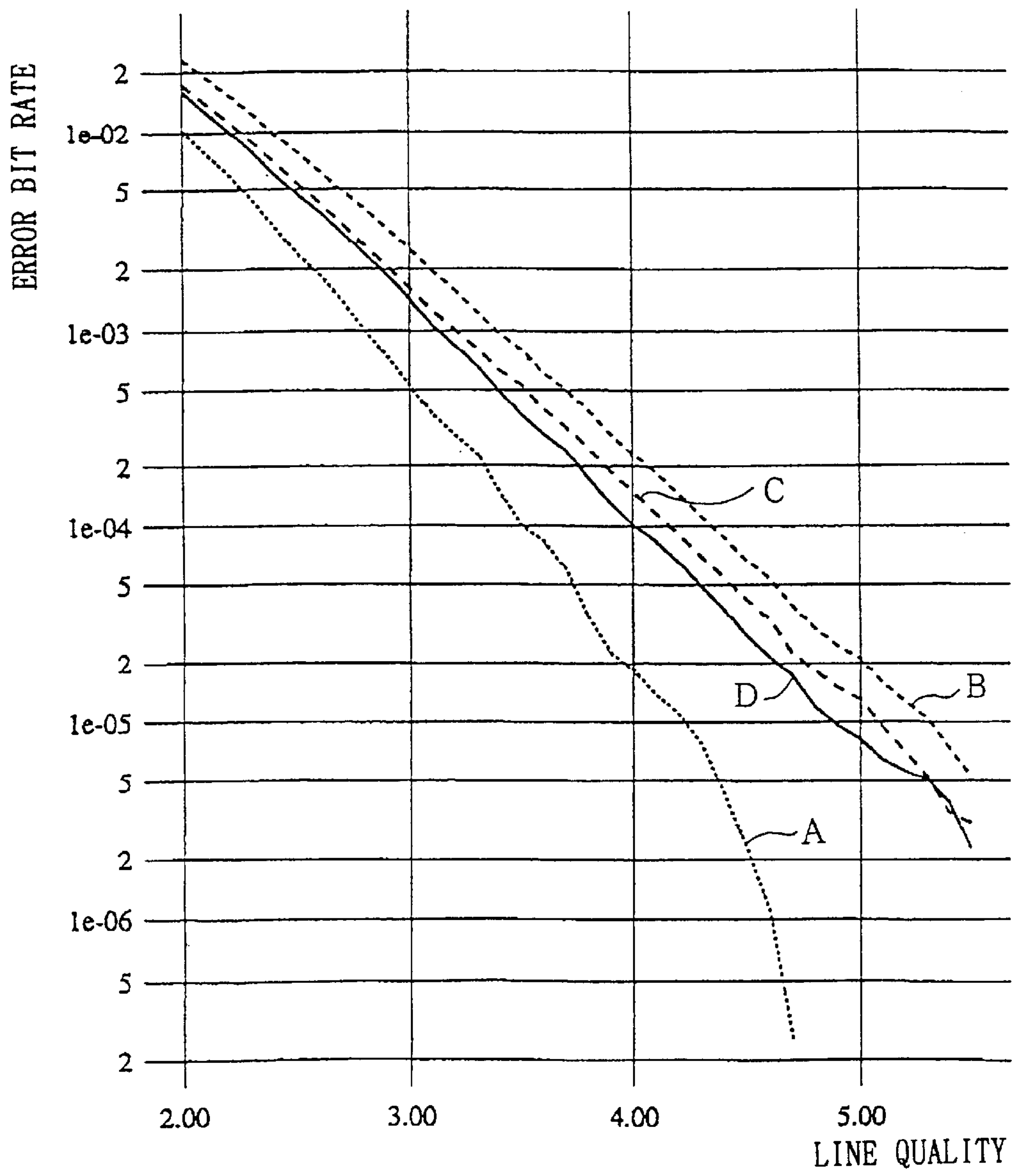
FIG. 17 is a characteristic curve for explaining a decoding characteristic of Viterbi decoding according to the present invention.

FIG. 17 shows a decoding characteristic when decoding data with the Viterbi decoder 37 of the present invention. In FIG. 17, a curve A denotes a characteristic when decoding data in accordance with a Viterbi algorithm of the present invention, that is, a characteristic when weighting the initial path metric value of each state in accordance with the initial value of each register of the convolutional encoder 31 and setting the state 00 determined by a tail bit when the path metric operation is completed as the start-point state for tracing-back. Moreover, a curve B denotes a characteristic when decoding data in accordance with a conventional Viterbi algorithm, that is, a characteristic when uniformly setting initial path metric values of states to, for example, a value "0" and performing tracing-back by always using the maximum-likelihood state according to the path metric operation as a start point. Furthermore, a curve C denotes a characteristic when setting a start-point state to the state 00 when the path metric operation is completed without weighing the initial path metric value of each state and a curve D denotes a characteristic when only weighting the initial path metric value of each state but not setting a start-point state to the state 00.

As shown in FIG. 17, according to the present invention, it is possible to improve the bit error rate for both cases of weighting the value of the initial path metric of each state in accordance with the initial value of a convolutional encoder and of setting a start-point state when the path metric operation is completed to the state 00 determined by a tail bit. Moreover, it is possible to greatly improve the bit error rate characteristic by weighting the value of the initial path metric of each state in accordance with the initial value of a convolutional encoder and setting a start-point state when the path metric operation is completed to the state 00 determined by a tail bit.

According to the above structure, it is possible to perform decoding at a high speed and further improve the decoding characteristic than before because the tracing-back frequency can be decreased more than ever by weighting the initial path metric value of each state in accordance with the initial value of each register of the convolutional encoder 31 when Viterbi decoding is performed and performing tracing-back with the state 00 determined by the value of a tail bit when the path metric operation is completed as a start-point state.

Figure 19:
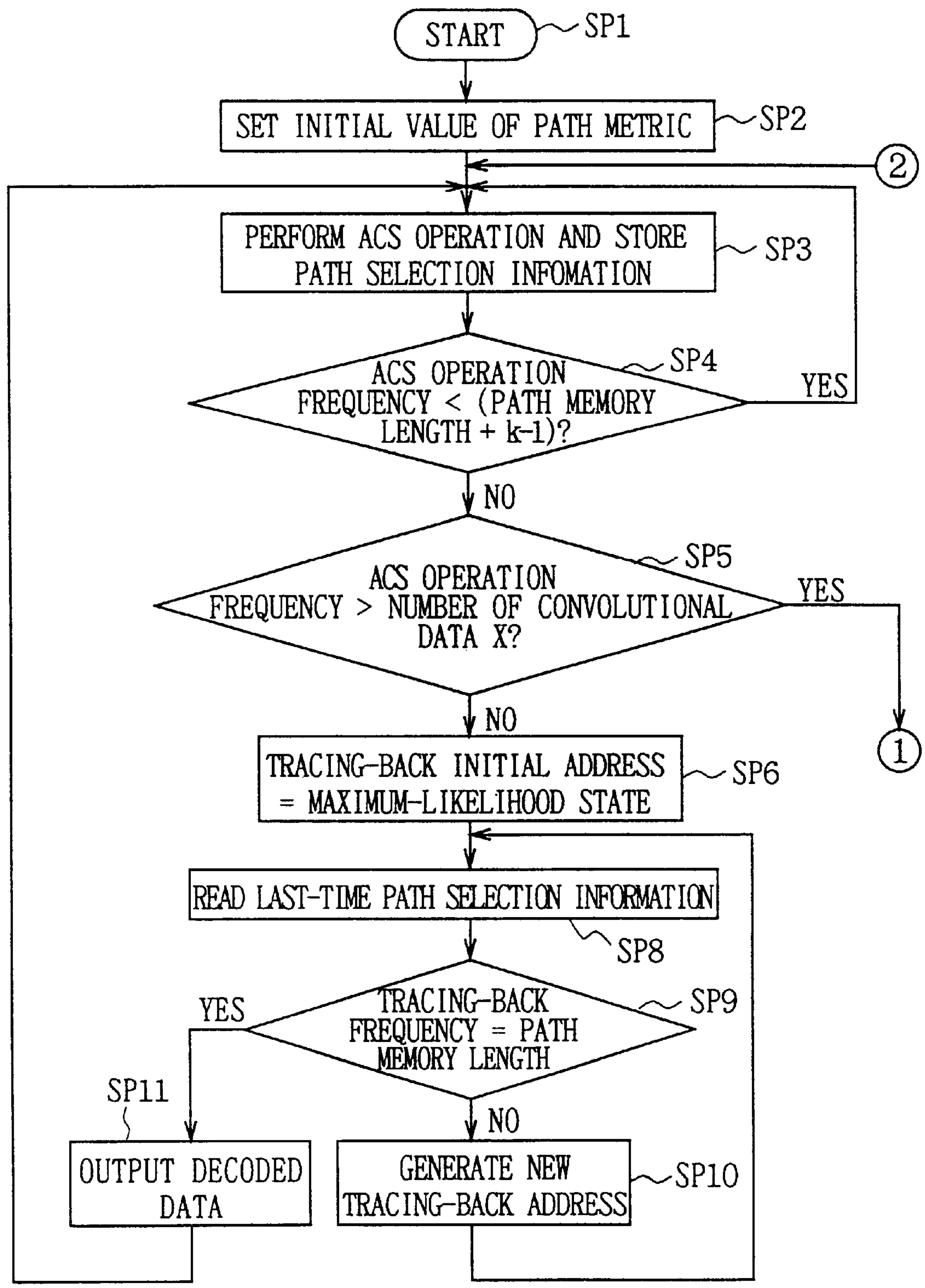
FIGS. 19 and 20 are flowcharts showing an algorithm for Viterbi decoding according to the present invention.
Figure 20:
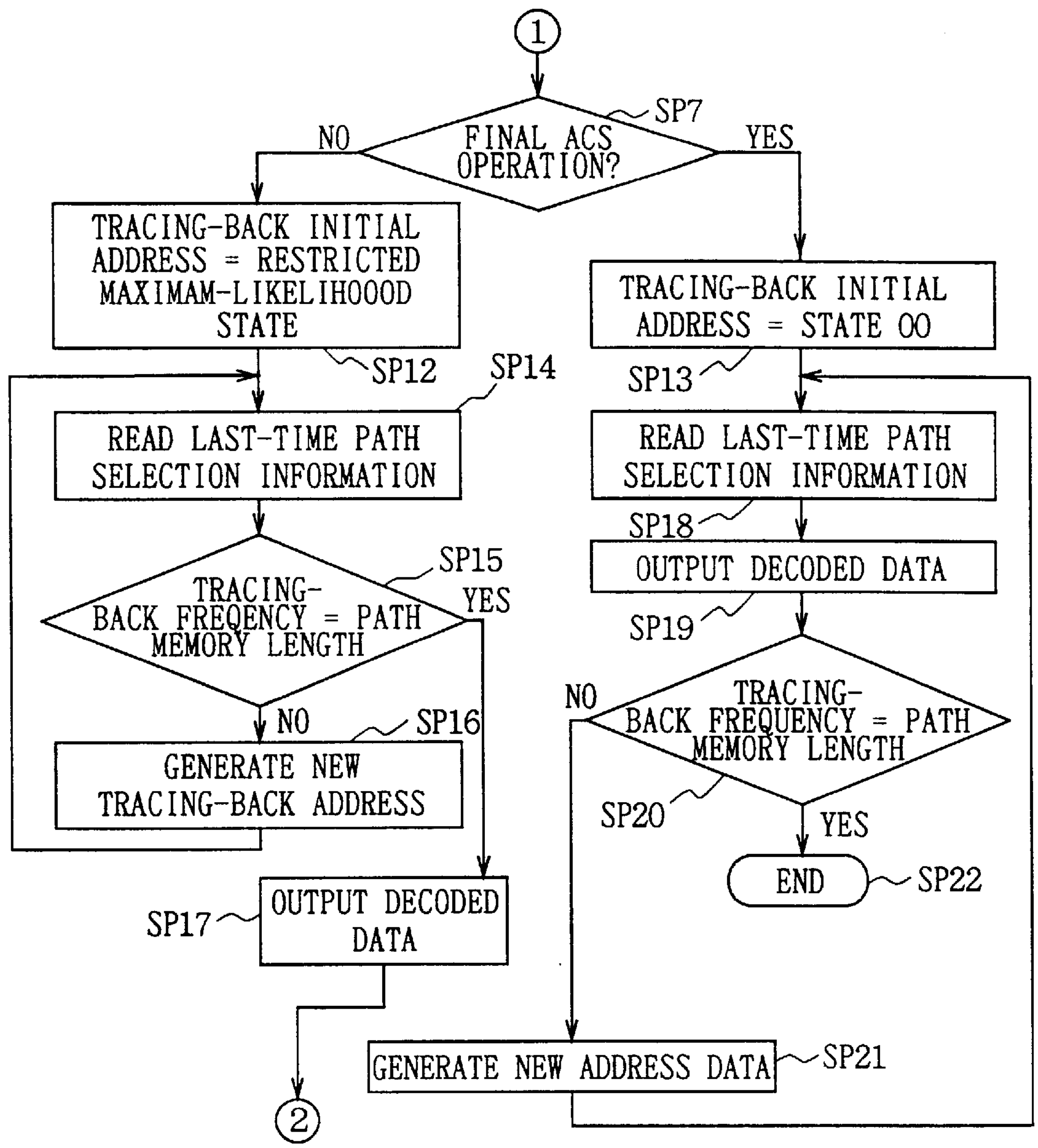

Next, FIGS. 19 and 20 show a decoding algorithm of the Viterbi decoder 37 added the above-described first, second and third processes. As shown in FIGS. 19 and 20 the Viterbi decoder 37 first sets the initial value of the path metric of each state to a weighted value shown in FIG. 15 in the step SP2 following the step SP1. Specifically, the decoder 37 sets initial path metrics of the states stored in the path-metric storage section 42 to the values shown in FIG. 15.

Then, in the next step SP3, the Viterbi decoder 37 performs the ACS operation based on the reception symbol D26 and stores the path selection information D35 by selecting a path in accordance with the ACS operation. Specifically, branch-metric operation circuit 40 first computes the branch metrics BM(0,0), BM(0,1), BM(1,0) and BM(1,1) of two symbols input as the reception symbols D26. Moreover, the ACS operation circuit 41 computes the path metric of each path considerable at the present time based on the above branch metrics and the last-time path metrics stored in the path-metric storage section 42 to select the maximum-likelihood path of each state and moreover, stores the path metrics of the selected maximum-likelihood path in the path-metric storage section 42 and furthermore, stores the path selection information D35 showing the selected path in the path-selection-information storage section 44.

Then in the next step SP4, the Viterbi decoder 37 decides whether the ACS-operation frequency is equal to (path memory length+k−1) times or less. When the ACS-operation frequency is less than the reference value, the processing in step SP3 is repeated. When the ACS-operation frequency reaches the reference value, the step SP5 is started. The above decision is made by, for example, the data estimation circuit 45 by counting the output frequency of the maximum-likelihood-state information D34. Moreover, in the case of this embodiment, a reference value is determined as (path memory length+8) times because the constraint length k is set to "9".

In the next step SP5, assuming the number of convolutional data excluding tail bits as X (in the case of this embodiment, the number of convolutional data X is 184 because eight tail bits are added to 184 bits sent in frames), the Viterbi decoder 37 decides whether the ACS operation frequency exceeds the number of convolutional data X or not. When the frequency does not exceed X, the step SP6 is started. When the frequency exceeds X, the step SP7 is started. The above decision is also made by the data estimation circuit 45. In this connection, the decision is the processing based on the above-described third processing to decide whether the ACS operation performed at present corresponds to an operation at the {final ACS operation-(k−2)}th time downward or not.

In the step SP6, the Viterbi decoder 37 sets the initial address for tracing-back to the maximum-likelihood state. That is, the data estimation circuit 45 sets the start-point state for tracing-back to the maximum-likelihood state detected by the maximum-likelihood detector 43.

Then in the next step SP8, the data estimation circuit 45 of the Viterbi decoder 37 reads the path selection information D36 one time before from the path-selection-information storage section 44 to perform tracing-back by one step. In the next step SP9, the data estimation circuit 45 decides whether the step frequency for tracing-back is equal to a path memory length or not. When the step frequency is not equal to the path memory length, the step SP10 is started. However, if the step frequency is equal to the path memory length, the step SP11 is started.

In the step SP10, the data estimation circuit 45 generates a new address for tracing-back based on the tracing-back performed just before and repeats the processing from the step SP8. That is, the data estimation circuit 45 sets the end-point state for the tracing-back performed just before as a start-point this time and performs tracing-back again from the step SP8.

On the other hand, in the step SP11, the data estimation circuit 45 decides that tracing-back is performed by the path memory length, estimates the received data for one bit based on a finally reached state and outputs the data as decoded data. When the processing is completed, the Viterbi decoder 37 returns to the step SP3 to repeat the processing.

On the contrary, when the step SP7 is started after the step SP5 because the ACS operation frequency exceeds the number of convolutional data X, the data estimation circuit 45 decides whether the ACS operation performed at present is the final ACS operation for the reception symbol D26 or not. When the ACS operation performed at present is not the final ACS operation, the step SP12 is started. When it is the final one, the step SP13 is started.

In the step SP12, the data estimation circuit 45 restricts the initial address for tracing-back to the prospective states shown in FIG. 18 in accordance with the ACS operation frequency and sets the initial address to a maximum-likelihood state out of the prospective states. For example, when the ACS operation is the (final ACS operation-7)th time, the data estimation circuit 45 selects a maximum-likelihood state having the smallest path metric out of the 128 prospective states shown in FIG. 18 so as to set the maximum-likelihood state as the start-point state for tracing-back.

In the next step SP14, the data estimation circuit 45 reads the path selection information D36 one time before from the path-selection-information storage section 44 and performs tracing-back by one step. In the next step SP15, the data estimation circuit 45 decides whether the step frequency for tracing-back is equal to a path memory length or not. When the step frequency is not equal to the path memory length, the step SP16 is started. When it is equal to the path memory length, the step SP17 is started.

In the step SP16, the data estimation circuit 45 generates a new address for tracing-back in accordance with the tracing-back performed just before and returns to the step SP14 to repeat the processing. That is, the data estimation circuit 45 sets the end-point state for the tracing-back performed just before as a start-point this time and performs tracing-back again from the step SP14.

On the other hand, in the step SP17, the data estimation circuit 45 decides that tracing-back is performed by the path memory length, estimates the received data for one bit based on a finally reached state and outputs the data as decoded data. When the processing is completed, the Viterbi decoder 37 returns to the step SP3 to repeat the processing.

On the contrary, when the step SP13 is started after the step SP7 because of the final ACS operation, the data estimation circuit 45 sets the initial address for tracing-back to the state 00 instead of setting it to the maximum-likelihood state detected by the maximum-likelihood detector 43.

In the next step SP18, the data estimation circuit 45 reads the path selection information D36 one time before from the path-selection-information storage section 44 to perform tracing-back by one step. In the next step SP19, the data estimation circuit 45 estimates the received data for one bit based on the state reached through the above tracing-back of one step and outputs the data as decoded data. Then in the step SP20, the data estimation circuit 45 decides whether the step frequency for tracing-back is equal to the path memory length or not. When the step frequency is not equal to the path memory length, the step SP21 is started. When the step frequency is equal to the path memory length, the circuit 45 decides that all received data is decoded and moves to the step SP22 to complete the processing.

In the step SP21, the data estimation circuit 45 generates a new address for tracing-back based on the one-step tracing-back performed just before and repeats the processing from the step SP18. That is, the data estimation circuit 45 sets the end-point state of the tracing-back performed just before as a start-point state this time and performs the tracing-back again from the step SP18. Thus, by executing the above Viterbi algorithm, the Viterbi decoder 37 successively decodes data from the reception symbol D26.

The communication terminal unit-10 having the above structure sets the value of each register of the convolutional encoder 31 to "0" under transmission, performs convolutional encoding by adding a tail bit having a constraint length of k−1 bits constituted with a value "0" to the tail of the transmission data D20 formed in frames, and transmits the transmission symbol D21 thus obtained via the interleaver 32 and transmitter 17.

On the other hand, under reception, the communication terminal unit 10 receives a symbol generated through the same processing as the above transmission, via the receiver 21, the deinterleaver 36 and the like and inputs the reception symbol D26 to the Viterbi decoder 37 to decode received data. In this case, the Viterbi decoder 37 sets the initial path metric of each state to be stored in the path-metric storage section 42 to a value weighted by noticing that the value of each register of the convolutional encoder 31 is initially set to "0" and computes a path metric and selects a path by successively starting the ACS operation under the above state. Moreover, the Viterbi decoder 37 decodes data one bit by one bit whenever the tracing-back for a path memory length is completed by using a maximum-likelihood state having the smallest path metric value as a start point, until the ACS operation reaches the number of convolutional data X excluding tail bits. Then, the Viterbi decoder 37 selects a maximum-likelihood state out of prospective states (see FIG. 18) determined by tail bits until the ACS operation reaches the final ACS operation for the reception symbol D26 after the ACS operation has exceeded the number of convolutional data X (that is, the ACS operations from the [final ACS operation-(k−2)]th time to the [final ACS operation-1]th time for the reception symbol D26), decodes data one bit by one bit whenever the tracing-back for a path memory length is completed by using the maximum-likelihood state as a start point. Further, the Viterbi decoder 37 decodes data one bit by one bit whenever the tracing-back for one step is completed by using the state 00 specified by a tail bit as a start point when the ACS operation reaches the final ACS operation for the reception symbol D26.

Thus, in the Viterbi decoder 37, since the initial path metric value of each state is set to a value weighted based on the initial value of each register of the convolutional encoder 31 instead of uniformly setting the initial path metric values, it is possible to make the value of a path metric more accurate than before and improve the decoding characteristic for Viterbi decoding by further accurately decoding data. Moreover, in the Viterbi decoder 37, since a maximum-likelihood state is selected out of the prospective states restricted by values of tail bits and tracing-back is performed by using the maximum-likelihood state as a start point, until the ACS operation reaches the final operation after it has exceeded the number of convolutional data X, it is possible to prevent tracing-back from being performed starting with an erroneous state which cannot be originally considered, accurately decode data, and further improve the Viterbi decoding characteristic. Furthermore, in the Viterbi decoder 37, since data is decoded one bit by one bit whenever performing tracing-back for one step by using the state 00 determined by the value of a tail bit added for convolutional encoding as a start-point state when the path metric operation becomes the final operation for the reception symbol D26, it is possible to reduce the number of steps for tracing-back compared to the case of performing tracing-back by a path memory length every time as before, increase the decoding speed, perform tracing-back from an originally-obtainable ideal state, and further accurately perform decoding.

In the above-described embodiment, the constraint length k for convolutional encoding is set to "9" and the encoding rate R is set to ½. However, the present invention is not restricted to the above case. It is also possible to use other values as the values of the constraint length k and encoding rate R.

Moreover, in the above-described embodiment, the initial path metric values shown in FIG. 15 are set. However, the present invention is not restricted to the above case. It is also possible to use another value to be set as initial path metric value. In short, it is possible to obtain the same advantage as the case described above by setting an initial path metric value weighted based on the initial value of each register of a convolutional encoder as the initial value of each state.

Furthermore, in the above-described embodiment, tracing-back is performed by using the state 00 as a start-point state when the path metric operation is completed. However, the, present invention is not restricted to the above case. It is also possible to set the start-point state to another state. In short, it is possible to obtain the same advantage as the case described above by setting the start-point state when the path metric operation is completed to a fixed state determined by the value of a tail bit instead of setting the start-point state to the maximum-likelihood state determined by the value of a path metric.

While there has been described in connection with the preferred embodiments of the invention, it will be obvious to those skilled in the art that various changes and modifications may be aimed, therefore, to cover in the appended claims all such changes and modifications as fall within the true spirit and scope of the invention.

What is claimed is:

1. A Viterbi decoding apparatus for adding a tail bit constituted with a predetermined value of (k−1) bits to a tail of a predetermined-length data string by assuming a constraint length of a convolutional encoder as "k", receiving a symbol string generated by setting an initial value of each register of a plurality of registers of a shift register device of said convolutional encoder to a predetermined value, convolutionally encoding said data string to which said tail bit is added with said convolutional encoder, and decoding said data string from said symbol string, said Viterbi decoding apparatus comprising:

decoding means for setting a path metric value weighted based on said initial value of each register of said plurality of shift registers as an initial path metric value of a respective state of a plurality of states, successively computing a path metric value of each state of said plurality of states whenever said symbol string is received based on said initial path metric value in order to store surviving paths in a path memory, decoding said data string one bit by one bit whenever tracing-back by a length of said path memory with a maximum-likelihood state determined based on said path metric value of each state as a start-point state until a path metric operation reaches a final operation for said symbol string is performed, and decoding said data string one bit by one bit whenever tracing-back for one-step with a fixed state determined based on a value of said tail bit as said start-point state when said path metric operation has reached said final operation for said symbol string is performed.

2. The Viterbi decoding apparatus according to claim 1, wherein said decoding means includes a memory for storing said initial path metric value of each state of said plurality of states and sets said initial path metric value based on data read out from said memory.

3. The Viterbi decoding apparatus according to claim 1, wherein said initial value of each register of said shift register device is set to "0".

4. The Viterbi decoding apparatus according to claim 1, wherein said tail bit is fully composed of "0".

5. The Viterbi decoding apparatus according to claim 1, wherein said decoding means selects said maximum-likelihood state from a plurality of prospective states determined based on said value of said tail bit and decodes said data string one bit by one bit whenever tracing-back by a length of said path memory is performed, with said maximum-likelihood state as said start-point state, until said path metric operation reaches said final operation for said symbol string after exceeding a number of data strings.

6. A Viterbi decoding apparatus for adding a tail bit constituted with a predetermined value of (k−1) bits to a tail of a predetermined-length data string by assuming a constraint length of a convolutional encoder as "k", receiving a symbol string generated by convolutionally encoding said data string to which said tail bit is added with said convolutional encoder, and decoding said data string from said symbol string, said Viterbi decoding apparatus comprising:

a decoder for performing a path metric operation of successively computing a path metric value of a plurality of states whenever said symbol string is received to store surviving paths in a path memory, for decoding said data string one bit by one bit whenever tracing-back by a length of said path memory with a maximum-likelihood state determined based on said path metric value of each state as a start-point state is performed until said path metric operation reaches a final operation for said symbol string, and for decoding said data string one bit by one bit whenever tracing-back by one step is performed with a fixed state determined based on a value of said tail bit as said start-point state when said path metric operation reaches said final operation for said symbol string.

7. The Viterbi decoding apparatus according to claim 6, wherein said tail bit is fully composed of "0".

8. The Viterbi decoding apparatus according to claim 6, wherein said decoder selects said maximum-likelihood state from a plurality of prospective states determined based on said value of said tail bit and decodes said data string one bit by one bit whenever said tracing-back by said length of said path memory using said maximum-likelihood state as said start-point state is performed, until said path metric operation reaches said final operation for said symbol string after exceeding a number of said data strings.

9. A Viterbi decoding method of adding a tail bit constituted with a predetermined value of (k−1) bits to a tail of a predetermined-length data string by assuming a constraint length of a convolutional encoder as "k", receiving a symbol string generated by setting an initial value of each register of a plurality of registers of a shift register device of said convolutional encoder to a predetermined value and convolutionally encoding said data string to which said tail bit is added with said convolutional encoder, and decoding said data string from said symbol string, said Viterbi decoding method comprising the steps of:

setting a path metric value weighted based on said initial value of each register of said plurality of registers as an initial path metric value of a respective state of a plurality of states;

successively computing said path metric value of each state of said plurality of states when said symbol string is received based on said initial path metric value to store surviving paths in a path memory;

decoding said data string one bit by one bit in order to perform tracing-back by a length of said path memory with a maximum-likelihood state determined based on said path metric value of each state as a start-point state until a path metric operation reaches a final operation for said symbol string; and decoding said data string one bit by one bit in order to perform tracing-back for one step with a fixed state determined based on a value of said tail bit as said start-point state when said path metric operation has reached said final operation for said symbol string.

10. The Viterbi decoding method according to claim 9, wherein said maximum-likelihood state is selected from a plurality of prospective states based on said value of said tail bit, and said data string is decoded one bit by one bit in order to perform tracing-back by said length of said path memory with said maximum-likelihood state as said start-point state, until said path metric operation reaches said final operation for said symbol string after exceeding a number of data strings.

* * * * *